(12) United States Patent
Osawa et al.

(10) Patent No.: US 11,075,094 B2
(45) Date of Patent: Jul. 27, 2021

(54) SUBSTRATE PROCESSING APPARATUS

(71) Applicant: SCREEN Holdings Co., Ltd., Kyoto (JP)

(72) Inventors: Mizuki Osawa, Kyoto (JP); Hiroshi Ebisui, Kyoto (JP)

(73) Assignee: SCREEN Holdings Co., Ltd.

( * ) Notice: Subject to any disclaimer, the term of this patent is extended or adjusted under 35 U.S.C. 154(b) by 282 days.

(21) Appl. No.: 16/012,814

(22) Filed: Jun. 20, 2018

(65) Prior Publication Data

US 2019/0006203 A1   Jan. 3, 2019

(30) Foreign Application Priority Data

Jun. 30, 2017   (JP) .............................. JP2017-129473

(51) Int. Cl.
| | |
|---|---|
| *H01L 21/67* | (2006.01) |
| *H01L 21/306* | (2006.01) |
| *H01L 21/02* | (2006.01) |
| *G02F 1/13* | (2006.01) |

(52) U.S. Cl.
CPC ...... *H01L 21/67023* (2013.01); *G02F 1/1303* (2013.01); *H01L 21/02057* (2013.01); *H01L 21/30604* (2013.01); *H01L 21/67017* (2013.01); *H01L 21/67028* (2013.01); *H01L 21/67051* (2013.01); *G02F 1/1316* (2021.01)

(58) Field of Classification Search
None
See application file for complete search history.

(56) References Cited

U.S. PATENT DOCUMENTS

| | | | |
|---|---|---|---|
| 8,216,417 B2* | 7/2012 | Fujiwara | ........... H01L 21/67057 156/345.15 |
| 2003/0226577 A1 | 12/2003 | Orll et al. | ...................... 134/1.3 |
| 2014/0158791 A1 | 6/2014 | Kiyotomi | ...................... 239/110 |
| 2019/0006203 A1* | 1/2019 | Osawa | .............. H01L 21/67017 |

FOREIGN PATENT DOCUMENTS

| | | |
|---|---|---|
| JP | 2002-170803 A | 6/2002 |
| JP | 2003-309102 A | 10/2003 |
| JP | 2004-363292 A | 12/2004 |
| JP | 2013-027842 A | 2/2013 |
| JP | 2013-030707 A | 2/2013 |
| JP | 2015-135843 A | 7/2015 |
| JP | 2016-111306 A | 6/2016 |

OTHER PUBLICATIONS

Machine Generated English Translation of the abstractor JP2004363292. Published Dec. 24, 2004 (Year: 2004).*

* cited by examiner

*Primary Examiner* — Sylvia MacArthur
(74) *Attorney, Agent, or Firm* — Ostrolenk Faber LLP

(57) ABSTRACT

A substrate processing apparatus includes a connection portion connected to the common piping and having a flow space in its interior, a chemical liquid supplying piping connected to the connection portion, a drain piping connected to the connection portion, and a cleaning liquid supplying piping connected to the connection portion, the connection portion has a plurality of ports aligned along a flow direction of the flow space, and a common port, which, among these ports, is connected to one end of the common piping, is disposed, in regard to the flow direction, between a drain port, which, among these ports, is connected to the drain piping, and a cleaning liquid supplying port, which, among these ports, is connected to the cleaning liquid supplying piping.

15 Claims, 17 Drawing Sheets

FIG. 13 First suction step

SUBSTRATE PROCESSING APPARATUS

BACKGROUND OF THE INVENTION

1. Field of the Invention

The present invention relates to a substrate processing apparatus and a substrate processing method. Examples of substrates to be processed include semiconductor wafers, substrates for liquid crystal displays, substrates for FPDs (flat panel displays), such as organic EL (electroluminescence) displays, etc., substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display device, etc., a substrate processing apparatus arranged to process substrates, such as semiconductor wafers, glass substrates for liquid crystal display devices, etc., is used. A single substrate processing type substrate processing apparatus that processes substrates one by one includes, for example, a spin chuck for rotating a substrate while holding it horizontally, a processing liquid supplying unit for supplying a processing liquid to the substrate held by the spin chuck, a top plate which faces the substrate held by the spin chuck, from above, and an upper nozzle housed in a central opening formed in a central portion of the top plate (see Japanese Unexamined Patent Application Publication No. 2015-135843).

A connection portion is connected via an upper piping to the upper nozzle. The connection portion has an inner wall and a flow space is formed in its interior. A processing liquid common line, an auxiliary recovery line, a chemical liquid introduction line, a processing liquid introduction line, a chemical liquid recovery line, and a pure water introduction line are connected to the connection portion in that order from one end side in a flow direction of the flow space.

A chemical liquid is supplied from the chemical liquid introduction line to the connection portion by both a valve opening and closing the chemical liquid introduction line and a valve opening the processing liquid common line being opened. The chemical liquid provided to the upper nozzle through the processing liquid common line is discharged from the upper nozzle. The chemical liquid is thereby supplied to the substrate and processing using the chemical liquid is applied to a major surface of the substrate.

SUMMARY OF THE INVENTION

The present inventors are studying the supplying of a cleaning liquid (water) to the connection portion after the chemical liquid processing to force out the chemical liquid from the flow space by the cleaning liquid. Specifically, the cleaning liquid is supplied to the flow space by opening a cleaning liquid piping (the pure water introduction line) while closing a drain piping (the auxiliary recovery line).

However, with Japanese Unexamined Patent Application Publication No. 2015-135843, at the connection portion, a common port, connected to a common piping (the upper piping), is disposed at an opposite side of a cleaning liquid supplying port, connected to the cleaning liquid piping, with respect to a drain port, connected to the drain piping, in regard to the flow direction of the flow space. Therefore, depending on a flow rate, etc., of the cleaning liquid, supplied from the cleaning liquid piping to the connection portion, the cleaning liquid may not be supplied favorably to a region in the flow space between the common port and the drain port supplying port, and the chemical liquid may not be forced out favorably from the region. Consequently, after connection portion cleaning, the chemical liquid may remain and be attached to a portion of the inner wall of the connection portion (for example, a portion between the drain port and the common port on the inner wall).

If the chemical liquid remains on a portion of the inner wall of the connection portion, cross-contamination of chemical liquids may occur in the flow space when another chemical liquid is supplied to the connection portion or the chemical liquid may crystallize on the inner wall of the connection portion. Crystallization of the chemical liquid may become a cause of particles.

Thus, an object of the present invention is to provide a substrate processing apparatus and a substrate processing method with which remaining of a chemical liquid in a flow space after connection portion cleaning can be suppressed or prevented to thereby enable satisfactory processing to be applied to a substrate.

The present invention provides a substrate processing apparatus including a substrate holding unit which holds a substrate, a common piping in communication with a discharge port arranged to discharge a processing liquid toward a major surface of the substrate held by the substrate holding unit, a connection portion connected to the common piping and having, in its interior, a flow space for a liquid to flow through, a chemical liquid supplying piping connected to the connection portion and supplying a chemical liquid to the connection portion, a drain piping connected to the connection portion and through which a liquid, drained from the connection portion, flows, and a cleaning liquid supplying piping connected to the connection portion and supplying a cleaning liquid to the connection portion, and where the connection portion has a plurality of ports aligned along a flow direction of the flow space, a plurality of pipings, including the common piping, the chemical liquid supplying piping, the cleaning liquid supplying piping, and the drain piping, are connected to these ports, and a common port, which, among these ports, is connected to the common piping, is disposed, in regard to the flow direction, between a drain port, which, among these ports, is connected to the drain piping, and a cleaning liquid supplying port, which, among these ports, is connected to the cleaning liquid supplying piping.

In the present specification, "port" refers to a connection port of another piping in a wall of the connection portion.

With the present arrangement, in regard to the flow direction of the flow space, the common port is disposed between the drain port and the cleaning liquid supplying port. That is, a region in the flow space between the common port and the cleaning liquid supplying port is included in a path leading from the cleaning liquid supplying port to the drain port. Therefore, in connection portion cleaning, the cleaning liquid can be made to flow satisfactorily through the region, and consequently, the chemical liquid can be forced out satisfactorily from the region by the cleaning liquid. Remaining of the chemical liquid in the flow space after connection portion cleaning can thus be suppressed or prevented. Contamination of a plurality of types of chemical liquids in the flow space of the connection portion and crystallization of a chemical liquid at an inner wall of the connection portion can thereby be prevented in advance, and therefore the substrate can be processed using a clean processing liquid from the connection portion.

In the preferred embodiment of the present invention, the drain port is disposed at one endmost side in the flow direction and the cleaning liquid supplying port is disposed at another endmost side in the flow direction.

With the present arrangement, the drain port is disposed at the one endmost side in the flow direction and the cleaning liquid supplying port is disposed at the other endmost side in the flow direction. In this case, a proportion that a volume of the region in the flow space between the drain port and the cleaning liquid supplying port occupies in a volume of the entire flow space is large. The cleaning liquid can thus be made to flow satisfactorily through the entirety of the flow space during the connection portion cleaning and the chemical liquid can thereby be forced out satisfactorily from the entirety of the flow space by the cleaning liquid.

In the preferred embodiment of the present invention, the common port is provided at a position such that, in the connection portion, a volume of a region in the flow space between the common port and the drain port is less than a volume of a region in the flow space between the common port and the cleaning liquid supplying port.

With the present arrangement, the volume of the region in the flow space between the common port and the drain port is less than the volume of the region in the flow space between the common port and the cleaning liquid supplying port. In another words, the volume of the region in the flow space between the common port and the cleaning liquid supplying port is greater than the volume of the region in the flow space between the common port and the drain port. That is, not only the proportion that the volume of the region in the flow space between the drain port and the cleaning liquid supplying port occupies in the volume of the entire flow space but a proportion that the volume of the region in the flow space between the common port and the cleaning liquid supplying port occupies in the volume of the entire flow space can also be made high. The chemical liquid can thus be forced out satisfactorily from the flow space both when draining the cleaning liquid, supplied from the cleaning liquid supplying piping to the connection portion, to the drain piping and when supplying the cleaning liquid, supplied from the cleaning liquid supplying piping to the connection portion, to the common piping.

In the preferred embodiment of the present invention, the common port is provided at a position such that, in the connection portion, a distance between the common port and the drain port is narrower than a distance between the common port and the cleaning liquid supplying port.

With the present arrangement, the distance between the common port and the drain port is narrower than the distance between the common port and the cleaning liquid supplying port. An arrangement such that the volume of the region in the flow space between the common port and the drain port is less than the volume of the region in the flow space between the common port and the cleaning liquid supplying port can thus be realized comparatively easily.

In the preferred embodiment of the present invention, the discharge port is provided to be immovable in a direction along the major surface of the substrate held by the substrate holding unit.

With the present arrangement, the discharge port is provided to be immovable in the direction along the major surface of the substrate.

In cleaning an interior of the flow space of the connection portion, it may be considered to drain the cleaning liquid or the chemical liquid forced out by the cleaning liquid from the discharge port via the common piping. However, if the discharge port is provided to be immovable in the direction along the major surface of the substrate held by the substrate holding unit, the cleaning liquid or the chemical liquid discharged from the discharge port may be supplied to the major surface of the substrate. It may thus not be possible to perform connection portion cleaning of a method where the cleaning liquid, etc., is discharged from the discharge port or restriction may be applied in performing the connection portion cleaning.

With the present arrangement, the cleaning liquid or the chemical liquid forced out by the cleaning liquid can be drained using the drain piping. And, in regard to the flow direction of the flow space, the common port is disposed between the drain port and the cleaning liquid supplying port such that, in the connection portion cleaning, the cleaning liquid can be made to flow satisfactorily through the region and the remaining of the chemical liquid in the flow space after the connection portion cleaning can thereby be suppressed or prevented.

Thus, the connection portion cleaning can be performed satisfactorily without supplying the cleaning liquid, etc., to the major surface of the substrate and the remaining of the chemical liquid in the flow space after the connection portion cleaning can be suppressed or prevented.

In the preferred embodiment of the present invention, the substrate processing apparatus further includes a facing member, having a substrate facing surface that faces the major surface of the substrate held by the substrate holding unit and is immovable in a direction along the major surface of the substrate. In this case, the discharge port may be formed on the substrate facing surface.

With the present arrangement, if the discharge port is formed on the immovable substrate facing surface, the discharge port cannot be moved in a direction along the major surface of the substrate held by the substrate holding unit. In this case, the connection portion cleaning can be performed satisfactorily without supplying the cleaning liquid, etc., to the major surface of the substrate and the remaining of the chemical liquid in the flow space after the connection portion cleaning can be suppressed or prevented.

A plurality of the chemical liquid supplying pipings may be connected to the connection portion and these chemical liquid supplying pipings may supply a plurality of mutually different types of chemical liquids to the connection portion.

A plurality of the cleaning liquid supplying pipings may be connected to the connection portion and these cleaning liquid supplying pipings may supply a plurality of mutually different types of cleaning liquids to the connection portion.

The cleaning liquid may be water.

The cleaning liquid may be a chemical liquid differing in liquid type from the chemical liquid.

In the preferred embodiment of the present invention, the substrate processing apparatus further includes a common valve for opening and closing the common piping, a chemical liquid supplying valve for opening and closing the chemical liquid supplying piping, a drain valve for opening and closing the drain piping, a cleaning liquid supplying valve for opening and closing the cleaning liquid supplying piping, and a controller which controls the opening and closing of the common valve, the chemical liquid supplying valve, the drain valve, and the cleaning liquid supplying valve. In this case, the controller may execute a chemical liquid discharging step of opening the common valve and the chemical liquid supplying valve while closing the drain valve and the cleaning liquid supplying valve to make the chemical liquid from the chemical liquid supplying piping be supplied to the discharge port via the connection portion and the common piping and be discharged toward the substrate from the discharge port, and a first cleaning step of opening the drain valve and the cleaning liquid supplying valve while closing the common valve and the chemical liquid supplying valve after the chemical liquid discharging step to supply the cleaning liquid from the cleaning liquid supplying piping to the connection portion and make the cleaning liquid be drained through the drain piping.

With the present arrangement, in the chemical liquid discharging step, the chemical liquid from the chemical liquid supplying piping is supplied to the discharge port via the connection portion and the common piping and the chemical liquid is discharged toward the substrate from the discharge port. After the chemical liquid discharging step, the chemical liquid is present throughout the entirety of the flow space. In the first cleaning step, the cleaning liquid from the cleaning liquid supplying piping flows into the flow space from the cleaning liquid supplying port and the cleaning liquid flows through the flow space and is guided out to the drain piping from the drain port.

In regard to the flow direction of the flow space, the common port is disposed between the drain port and the cleaning liquid supplying port. That is, the region in the flow space between the common port and the cleaning liquid supplying port is included in the path leading from the cleaning liquid supplying port to the drain port. Therefore, in the connection portion cleaning, the cleaning liquid can be made to flow satisfactorily through the region, and consequently, the chemical liquid can be forced out satisfactorily from the region by the cleaning liquid.

In the preferred embodiment of the present invention, the controller further executes a second cleaning step of opening the common valve, the drain valve, and the cleaning liquid supplying valve while closing the chemical liquid supplying valve after the first cleaning step to supply the cleaning liquid from the cleaning liquid supplying piping to the connection portion and meanwhile make the cleaning liquid be drained through the drain piping and be discharged from the discharge port through the common piping.

With the present arrangement, in the second cleaning step, the cleaning liquid from the cleaning liquid supplying piping flows into the flow space and the cleaning liquid is drained through the drain piping and discharged from the discharge port through the common piping. If a liquid that is used as a rinse liquid is adopted as the cleaning liquid, it is also possible to supply the cleaning liquid to the major surface of the substrate. In this case, drying of the major surface of the substrate can be prevented. Also, the second cleaning step is performed after the first cleaning step and therefore the chemical liquid is hardly contained in the cleaning liquid supplied to the major surface of the substrate in the second cleaning step. Supplying of the chemical liquid to the major surface of the substrate in the second cleaning step can thereby be suppressed or prevented. Further, in the second cleaning step, cleaning of the connection portion and cleaning of the common piping can be performed in parallel. Consequently, shortening of processing time can be achieved.

In the preferred embodiment of the present invention, the controller further executes a third cleaning step of opening the common valve and the cleaning liquid supplying valve while closing the chemical liquid supplying valve and the drain valve after the first cleaning step to supply the cleaning liquid from the cleaning liquid supplying piping to the connection portion and meanwhile make the cleaning liquid be discharged from the discharge port through the common piping.

With the present arrangement, in the third cleaning step, the cleaning liquid from the cleaning liquid supplying piping flows into the flow space and the cleaning liquid is discharged from the discharge port through the common piping. If a liquid that is used as a rinse liquid is adopted as the cleaning liquid, it is also possible to supply the cleaning liquid to the major surface of the substrate. In this case, drying of the major surface of the substrate can be prevented. Also, the third cleaning step is performed after the first cleaning step and therefore the chemical liquid is hardly contained in the cleaning liquid supplied to the major surface of the substrate in the third cleaning step. Supplying of the chemical liquid to the major surface of the substrate in the third cleaning step can thereby be suppressed or prevented.

In the preferred embodiment of the present invention, the substrate processing apparatus further includes a suction piping connected to the connection portion, a suction apparatus for evacuating an interior of the suction piping, and a suction valve for opening and closing the suction piping. In this case, the controller controls operation of the suction apparatus and controls the opening and closing of the suction valve, and the controller may execute a first suctioning step of suctioning all of the liquid present in an interior of the common piping and in the flow space by the suction apparatus after the first cleaning step.

With the present arrangement, all of the liquid present in the interior of the common piping and in the flow space is suctioned after the first cleaning step. All of the cleaning liquid can thus be drained from the interior of the common piping and the flow space and remaining of the cleaning liquid in the flow space after the first cleaning step can thereby be prevented.

In the preferred embodiment of the present invention, the substrate processing apparatus further includes a suction piping connected to the connection portion, a suction apparatus for evacuating an interior of the suction piping, and a suction valve for opening and closing the suction piping. In this case, the controller controls operation of the suction apparatus and controls the opening and closing of the suction valve, and the controller may execute a second suctioning step of suctioning all of the liquid present in an interior of the common piping and in the flow space by the suction apparatus before the first cleaning step.

With the present arrangement, all of the chemical liquid can be drained from the interior of the common piping and in the flow space before the first cleaning step. The cleaning liquid is then supplied to the flow space after all of the chemical liquid is drained. In this case, the chemical liquid can be drained more satisfactorily from the flow space in comparison to a case of supplying the cleaning liquid to the flow space in a state where the chemical liquid is present in the flow space. The remaining of the chemical liquid in the flow space after the first cleaning step can thereby be suppressed more effectively.

The present invention provides a substrate processing method executed in a substrate processing apparatus that includes a common valve for opening and closing a common piping in communication with a discharge port, a chemical liquid supplying valve for opening and closing a chemical liquid supplying piping connected to the common valve via a connection portion having a flow space in its interior, a drain valve for opening and closing a drain piping through which a liquid drained from the connection portion, and a cleaning liquid supplying valve for opening and closing a cleaning liquid supplying piping supplying a cleaning liquid to the connection portion, and wherein a common port, which, among a plurality of ports aligned along a flow direction of the flow space, is connected to the common piping, is disposed, in regard to the flow direction, between a drain port, which, among these ports, is connected to the drain piping, and a cleaning liquid supplying port, which, among these ports, is connected to the cleaning liquid supplying piping, the substrate processing method including a chemical liquid discharging step of opening the common valve and the chemical liquid supplying valve while closing the drain valve and the cleaning liquid supplying valve to make the chemical liquid from the chemical liquid supplying piping be supplied to the discharge port via the connection portion and the common piping and be discharged toward the substrate from the discharge port, and a first cleaning step of opening the drain valve and the cleaning liquid supplying valve while closing the common valve and the chemical liquid supplying valve after the chemical liquid discharging step to supply the cleaning liquid from the cleaning liquid supplying piping to the connection portion and make the cleaning liquid be drained through the drain piping.

With the present method, in the chemical liquid discharging step, the chemical liquid from the chemical liquid supplying piping is supplied to the discharge port via the connection portion and the common piping and the chemical liquid is discharged toward the substrate from the discharge port. After the chemical liquid discharging step, the chemical liquid is present throughout the entirety of the flow space. In the first cleaning step, the cleaning liquid from the cleaning liquid supplying piping flows into the flow space from the cleaning liquid supplying port and the cleaning liquid flows through the flow space and is guided out to the drain piping from the drain port.

In regard to the flow direction of the flow space, the common port is disposed between the drain port and the cleaning liquid supplying port. That is, a region in the flow space between the common port and the cleaning liquid supplying port is included in a path leading from the cleaning liquid supplying port to the drain port. Therefore, in the first cleaning step, the cleaning liquid can be made to flow satisfactorily through the region, and consequently, the chemical liquid can be forced out satisfactorily from the region by the cleaning liquid. Contamination of a plurality of types of chemical liquids in the flow space of the connection portion and crystallization of a chemical liquid at an inner wall of the connection portion can thereby be prevented in advance, and therefore the substrate can be processed using a clean processing liquid from the connection portion.

In the preferred embodiment of the present invention, the drain port is disposed at one endmost side in the flow direction and the cleaning liquid supplying port is disposed at another endmost side in the flow direction.

With the present method, the drain port is disposed at the one endmost side in the flow direction and the cleaning liquid supplying port is disposed at the other endmost side in the flow direction. In this case, a proportion that a volume of a region in the flow space between the drain port and the cleaning liquid supplying port occupies in a volume of the entire flow space is large. The cleaning liquid can thus be made to flow satisfactorily through the entirety of the flow space during connection portion cleaning and the chemical liquid can thereby be forced out satisfactorily from the entirety of the flow space by the cleaning liquid.

In the preferred embodiment of the present invention, the method further includes a second cleaning step of opening the common valve, the drain valve, and the cleaning liquid supplying valve while closing the chemical liquid supplying valve after the first cleaning step to supply the cleaning liquid from the cleaning liquid supplying piping to the connection portion and meanwhile make the cleaning liquid be drained through the drain piping and be discharged from the discharge port through the common piping.

With the present method, in the second cleaning step, the cleaning liquid from the cleaning liquid supplying piping flows into the flow space and the cleaning liquid is drained through the drain piping and discharged from the discharge port through the common piping. If a liquid that is used as a rinse liquid is adopted as the cleaning liquid, it is also possible to supply the cleaning liquid to the major surface of the substrate. In this case, drying of the major surface of the substrate can be prevented. Also, the second cleaning step is performed after the first cleaning step and therefore the chemical liquid is hardly contained in the cleaning liquid supplied to the major surface of the substrate in the second cleaning step. Supplying of the chemical liquid to the major surface of the substrate in the second cleaning step can thereby be suppressed or prevented. Further, in the second cleaning step, cleaning of the connection portion and cleaning of the common piping can be performed in parallel. Consequently, shortening of processing time can be achieved.

In the preferred embodiment of the present invention, the substrate processing method further includes a third cleaning step of opening the common valve and the cleaning liquid supplying valve while closing the chemical liquid supplying valve and the drain valve after the first cleaning step to supply the cleaning liquid from the cleaning liquid supplying piping to the connection portion and meanwhile make the cleaning liquid be discharged from the discharge port through the common piping.

With the present method, in the third cleaning step, the cleaning liquid from the cleaning liquid supplying piping flows into the flow space and the cleaning liquid is discharged from the discharge port through the common piping. If a liquid that is used as a rinse liquid is adopted as the cleaning liquid, it is also possible to supply the cleaning liquid to the major surface of the substrate. In this case, drying of the major surface of the substrate can be prevented. Also, the third cleaning step is performed after the first cleaning step and therefore the chemical liquid is hardly contained in the cleaning liquid supplied to the major surface of the substrate in the third cleaning step. Supplying of the chemical liquid to the major surface of the substrate in the third cleaning step can thereby be suppressed or prevented.

In the preferred embodiment of the present invention, the substrate processing method includes a first suctioning step of suctioning all of the liquid present in an interior of the common piping and in the flow space after the first cleaning step.

With the present method, all of the liquid present in the interior of the common piping and in the flow space is suctioned after the first cleaning step. All of the cleaning liquid can thus be drained from the interior of the common piping and the flow space and remaining of the cleaning liquid in the flow space after the first cleaning step can thereby be prevented.

In the preferred embodiment of the present invention, the substrate processing method executes a second suctioning step of suctioning all of the liquid present in an interior of the common piping and in the flow space before the first cleaning step.

With the present arrangement, all of the chemical liquid can be drained from the interior of the common piping and in the flow space before the first cleaning step. The cleaning liquid is then supplied to the flow space after all of the chemical liquid is drained. In this case, the chemical liquid can be drained more satisfactorily from the flow space in comparison to a case of supplying the cleaning liquid to the flow space in a state where the chemical liquid is present in the flow space. The remaining of the chemical liquid in the flow space after the first cleaning step can thereby be suppressed more effectively.

The aforementioned and yet other objects, features, and effects of the present invention will be made clear by the following description of the preferred embodiment with reference to the attached drawings.

DETAILED DESCRIPTION OF PREFERRED EMBODIMENTS

Figure 1:
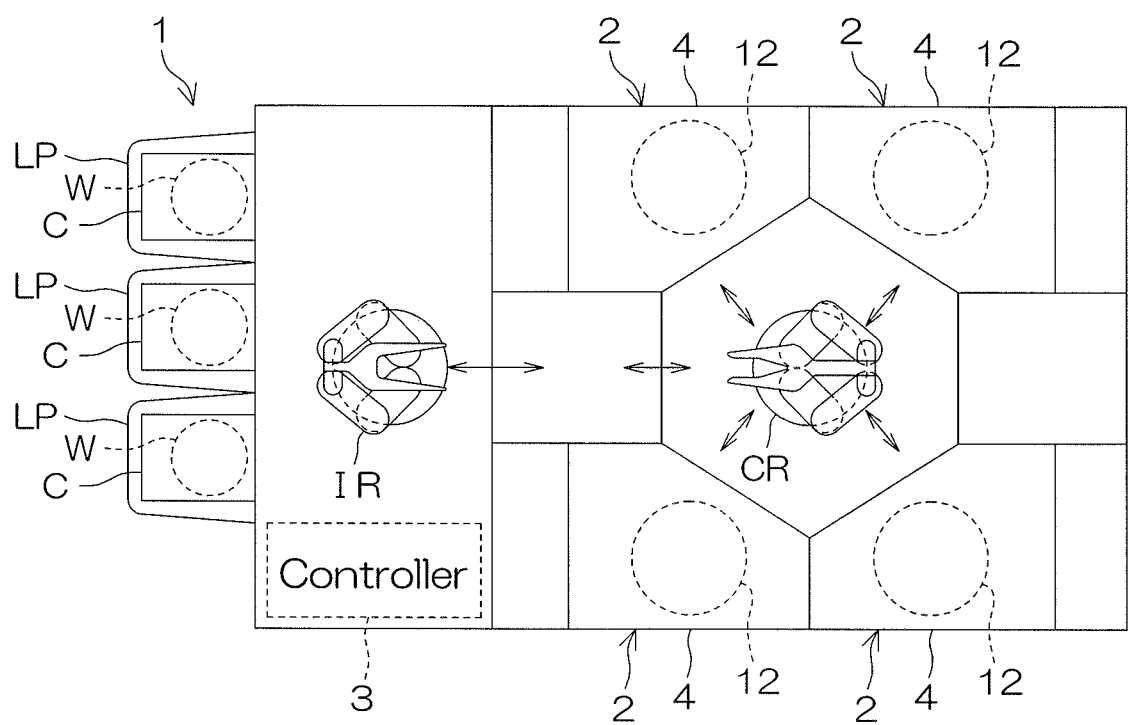
FIG. 1 is an illustrative plan view for describing a layout of an interior of a substrate processing apparatus according to a preferred embodiment of the present invention.

FIG. 1 is an illustrative plan view for describing a layout of an interior of a substrate processing apparatus 1 according to a preferred embodiment of the present invention. The substrate processing apparatus 1 is a single substrate processing type apparatus that processes substrates W, such as silicon wafers, etc., one by one. In the present preferred embodiment, the substrates W are disk-shaped substrate. The substrate processing apparatus 1 includes a plurality of processing units 2 which processes the substrates W with processing liquids, load ports LP, in each of which is placed a substrate container C that houses a plurality of the substrates W to be processed by the processing units 2, transfer robots IR and CR, transferring the substrates W between the load ports LP and the processing units 2, and a controller 3 which controls the substrate processing apparatus 1. The transfer robot IR transfers the substrates W between the substrate containers C and the substrate transfer robot CR. The substrate transfer robot CR transfers the substrates W between the transfer robot IR and the processing units 2. These processing units 2 have, for example, the same arrangement.

Figure 2:
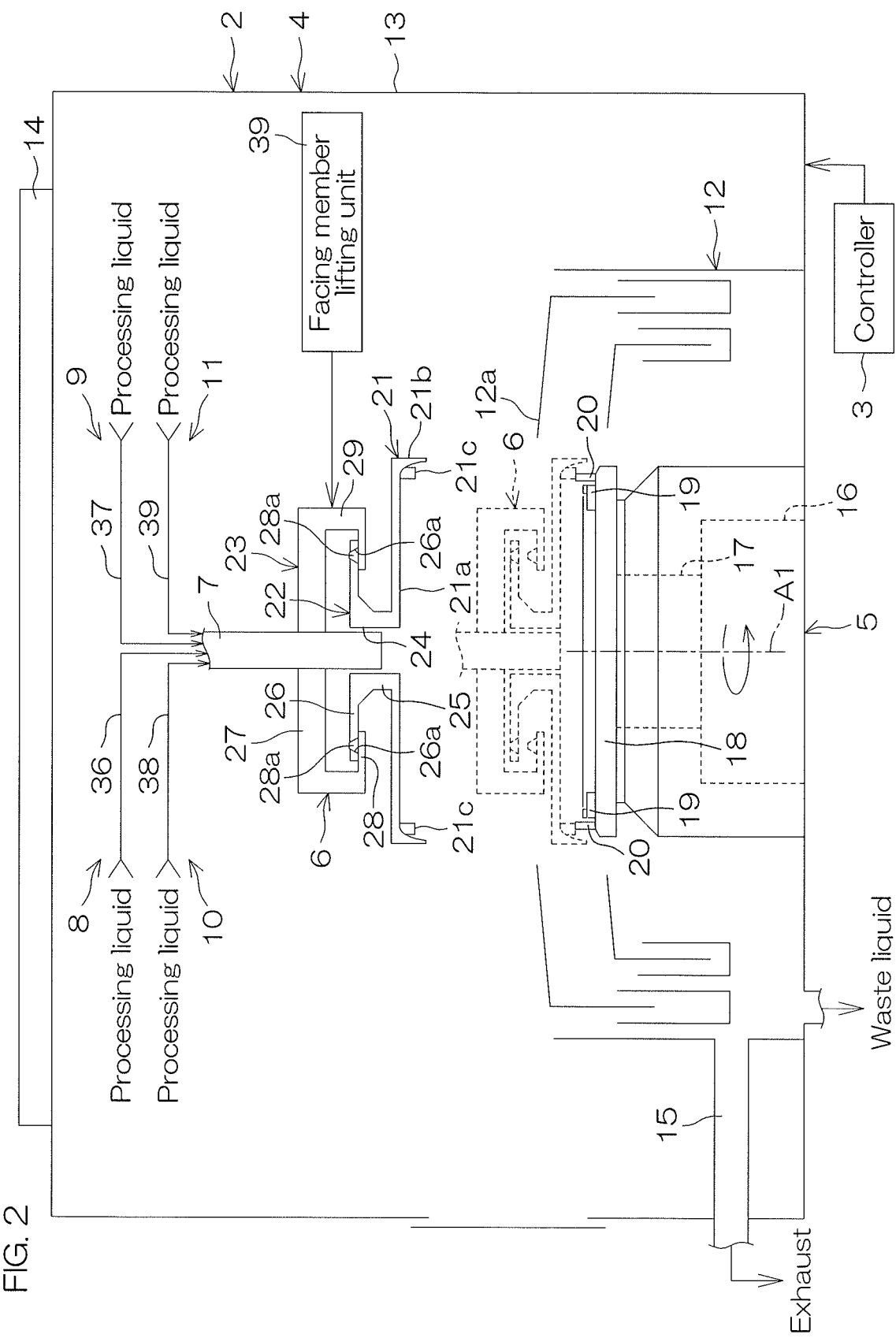
FIG. 2 is an illustrative sectional view for describing an arrangement example of a processing unit shown in FIG. 1.
Figure 3:
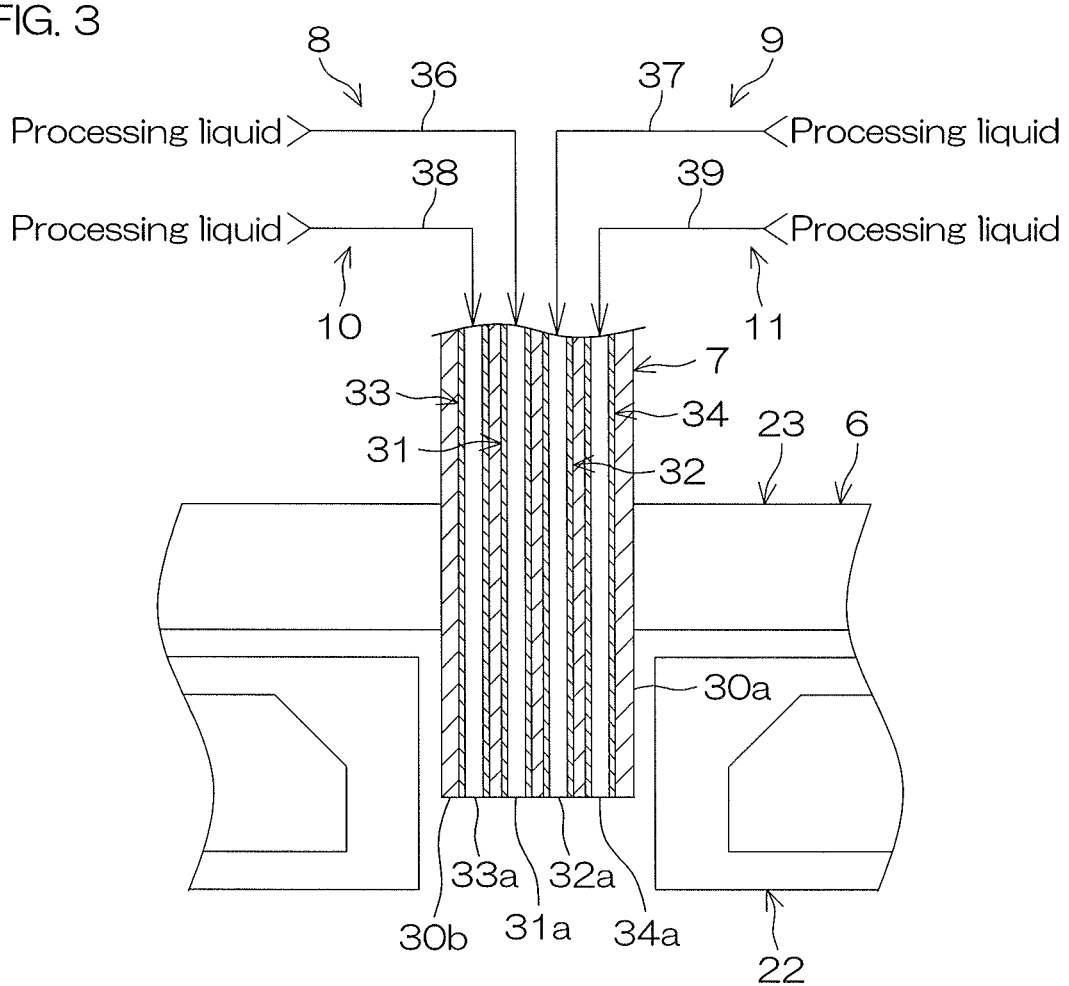
FIG. 3 is a vertical sectional view of a central axis nozzle shown in FIG. 2.
Figure 4:
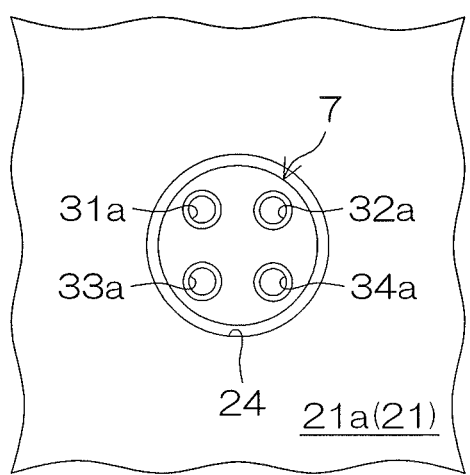
FIG. 4 is a bottom view of the central axis nozzle.

FIG. 2 is an illustrative sectional view for describing an arrangement example of a processing unit 2. FIG. 3 is a vertical sectional view of a central axis nozzle 7. FIG. 4 is a bottom view of the central axis nozzle 7.

The processing unit 2 includes a box-shaped chamber 4, a spin chuck (substrate holding unit) 5 which holds a single substrate W in a horizontal orientation inside the chamber 4 and rotating the substrate W around a vertical rotational axis A1 passing through a center of the substrate W, a facing member 6 which faces an upper surface (major surface) of the substrate W held by the spin chuck 5, a central axis nozzle 7 which passes up and down through an interior of the facing member 6 and arranged to discharge processing liquids toward a central portion of the upper surface of the substrate W held by the spin chuck 5, first, second, third, and fourth processing liquid supplying units 8, 9, 10, and 11, each arranged to supply a processing liquid to the central axis nozzle 7, and a cylindrical processing cup 12 which surrounds a side of the spin chuck 5.

The chamber 4 includes a box-shaped partition wall 13 which houses the spin chuck 5 and the nozzle, an FFU (fan filter unit) 14 as a blower unit sending clean air (air filter by a filter) inside the partition wall 13 from an upper portion of the partition wall 13, and an exhaust duct 15 which exhausts gas inside the chamber 4 from a lower portion of the partition wall 13. The FFU 14 is disposed above the partition wall 13 and is mounted on a ceiling of the partition wall 13. The FFU 14 sends the clean air downward into the chamber 4 from the ceiling of the partition wall 13. The exhaust duct 15 is connected to a bottom portion of the processing cup 12 and guides the gas inside the chamber 4 out toward exhaust processing equipment provided in a plant in which the substrate processing apparatus 1 is installed. A down flow (downward flow), flowing downward inside the chamber 4, is thus formed by the FFU 14 and the exhaust duct 15. The processing of the substrate W is performed in a state in which the down flow is formed inside the chamber 4.

As the spin chuck 5, a clamping type chuck, which clamps the substrate W in horizontal directions to hold the substrate W horizontally, is adopted. Specifically, the spin chuck 5 includes a spin motor 16, a spin shaft 17, made integral to a driveshaft of the spin motor 16, and a disk-shaped spin base 18, mounted substantially horizontally on an upper end of the spin shaft 17.

A plurality (not less than three; for example, six) of clamping members 19 are disposed at a peripheral edge portion of an upper surface of the spin base 18. At the upper surface peripheral edge portion of the spin base 18, these clamping members 19 are disposed at suitable intervals on a circumference corresponding to an outer peripheral shape of the substrate W. On the upper surface of the spin base 18, a plurality (not less than three) of facing member supporting portions 20, arranged to support the facing member 6 from below are disposed on a circumference centered at the rotational axis A1. A distance between each facing member supporting portion 20 and the rotational axis A1 is set to be greater than a distance between each clamping member 19 and the rotational axis A1.

Also, the spin chuck 5 is not restricted to a clamping type and, for example, a vacuum suction type arrangement (vacuum chuck) that vacuum-suctions a rear surface of the substrate W to hold the substrate W in a horizontal orientation and further performs rotation around a vertical rotational axis in this state to rotate the substrate W held by the spin chuck 5 may be adopted instead.

The facing member 6 is a driven type facing member (that is, a shielding member) that rotates in accordance with the spin chuck 5. That is, the facing member 6 is integrally rotatably supported by the spin chuck 5 during substrate processing.

The facing member 6 includes a shielding plate 21, an engaging portion 22, provided to be capable of being raised and lowered in accompaniment with the shielding plate 21, and a supporting portion 23, arranged to engage with the engaging portion 22 and support the shielding plate 21 from above.

The shielding plate 21 is disk-shaped and has a greater diameter than the substrate W. The shielding plate 21 has, at its lower surface, a circular substrate facing surface 21a which faces an entirety of the upper surface of the substrate W, a circular annular collar portion 21b, projecting downward at a peripheral edge portion of the substrate facing surface 21a, and a spin chuck engaging portions 21c which is provided on the substrate facing surface 21a and arranged to engage with the facing member supporting portions 20. A penetrating hole 24 which penetrates up and down through the facing member 6, is formed in a central portion of the substrate facing surface 21a. The penetrating hole 24 is defined by a circular cylindrical inner peripheral surface.

The engaging portion 22 includes a circular cylindrical portion 25, surrounding a periphery of the penetrating hole 24 at an upper surface of the shielding plate 21, and a flange portion 26, spreading radially outward from an upper end of the circular cylindrical portion 25. The flange portion 26 is positioned higher than a flange supporting portion 28, to be described next and included in the supporting portion 23, and an outer periphery of the flange portion 26 is made greater in diameter than an inner periphery of the flange supporting portion 28.

The supporting portion 23 includes a supporting portion main body 27, which, for example, is substantially disk-shaped, the horizontal flange supporting portion 28, and a connection portion 29, connecting the supporting portion main body 27 and the flange supporting portion 28.

The central axis nozzle 7 extends in an up/down direction along a vertical axis passing through centers of the shielding plate 21 and the substrate W, that is, along the rotational axis A1. The central axis nozzle 7 is disposed above the spin chuck 5 and passes through internal spaces of the shielding plate 21 and the supporting portion 23. The central axis nozzle 7 is raised and lowered together with the shielding plate 21 and the supporting portion 23.

The central axis nozzle 7 includes a circular columnar casing 30, extending up and down in an interior of the penetrating hole 24, and a first nozzle piping 31, a second nozzle piping 32, a third nozzle piping 33, and a fourth nozzle piping 34 that pass up and down through an interior of the casing 30. The casing 30 has a circular cylindrical outer peripheral surface 30a and a facing surface 30b, provided at a lower end portion of the casing 30 and facing a central portion of the upper surface of the substrate W. Each of the first to fourth nozzle pipings 31 to 34 is an inner tube.

A facing member lifting unit 39, arranged to raise and lower the supporting portion 23 to raise and lower the facing member 6, is coupled to the supporting portion 23. The facing member lifting unit 39 is of an arrangement that includes a servo motor, a ball screw mechanism, etc.

The facing member lifting unit 39 raises and lowers the facing member 6 and the first to fourth nozzle pipings 31 to 34, with the supporting portion 23, in a vertical direction. The facing member lifting unit 39 raises and lowers the shielding plate 21 and the first to fourth nozzle pipings 31 to 34 between a proximity position, at which the substrate facing surface 21a of the shielding plate 21 is proximal to the upper surface of the substrate W held by the spin chuck 5, and a retreat position, set above the proximity position. The facing member lifting unit 39 is capable of holding the shielding member 21 at respective positions between the proximity position and the retreat position.

By the facing member lifting unit 39, the supporting portion 23 can be raised and lowered between a lower position (position indicated by broken lines in FIG. 2) and an upper position (position indicated by solid lines in FIG. 2), and the shielding plate 21 of the facing member 6 can thereby be raised and lowered between the proximity position (position indicated by broken lines in FIG. 2) of being proximal to the upper surface of the substrate W held by the spin chuck 5 and the retreat position (position indicated by solid lines in FIG. 2) of being retreated largely upward from the spin chuck 5.

Specifically, in a state where the supporting portion 23 is positioned at the upper position, the flange supporting portion 28 of the supporting portion 23 and the flange portion 26 engage and the engaging portion 22, the shielding plate 21, and the central axis nozzle 7 are thereby supported by the supporting portion 23. That is, the shielding plate 21 is suspended by the supporting portion 23.

In a state where the supporting portion 23 is positioned at the upper position, the shielding plate 21 is positioned in a peripheral direction with respect to the supporting portion 23 by projections 28a, projected from an upper surface of the flange supporting portion 28, engaging with engaging holes 26a, formed in the flange portion 26 at intervals in the peripheral direction.

When the facing member lifting unit 39 lowers the supporting portion 23 from the upper position, the shielding plate 21 is also lowered from the retreat position. When the spin chuck engaging portions 21c of the shielding plate 21 thereafter contact the facing member supporting portions 20, the shielding plate 21 and the central axis nozzle 7 are received by the facing member supporting portions 20. And, when the facing member lifting unit 39 lowers the supporting portion 23, the engagement of the flange supporting portion 28 of the supporting portion 23 and the flange portion 26 is released, and the engaging portion 22, the shielding plate 21, and the central axis nozzle 7 separate from the supporting portion 23 and become supported by the spin chuck 5. In this state, the shielding plate 21 is rotated in accompaniment with the rotation of the spin chuck 5 (spin base 18).

The first nozzle piping 31 extends in the vertical direction. A lower end of the first nozzle piping 31 opens at the facing surface 30b of the casing 30 and forms a first discharge port 31a. The processing liquid from the first processing liquid supplying unit 8 is supplied to the first nozzle piping 31.

The second nozzle piping 32 extends in the vertical direction. A lower end of the second nozzle piping 32 opens at the facing surface 30b of the casing 30 and forms a second discharge port 32a. The processing liquid from the second processing liquid supplying unit 9 is supplied to the second nozzle piping 32.

The third nozzle piping 33 extends in the vertical direction. A lower end of the third nozzle piping 33 opens at the facing surface 30b of the casing 30 and forms a third discharge port 33a. The processing liquid from the third processing liquid supplying unit 10 is supplied to the third nozzle piping 33.

The fourth nozzle piping 34 extends in the vertical direction. A lower end of the fourth nozzle piping 34 opens at the facing surface 30b of the casing 30 and forms a fourth discharge port 34a. The processing liquid from the fourth processing liquid supplying unit 11 is supplied to the fourth nozzle piping 34.

The processing liquids supplied from the first, second, third, and fourth processing liquid supplying units 8, 9, 10, and 11 to the first, second, third, and fourth nozzle pipings 31, 32, 33, and 34 include a chemical liquid and water.

The chemical liquid may be a liquid containing, for example, at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH tetramethylammonium hydroxide, etc.), a first chemical liquid, an organic solvent, a surfactant, and a corrosion inhibitor.

The first chemical liquid may be a first chemical liquid for silicon or a first chemical liquid for metal. The first chemical liquid for silicon is a first chemical liquid that hydrophobizes silicon (Si) itself or a compound that contains silicon. The first chemical liquid for silicon is, for example, a silane coupling agent. The silane coupling agent includes, for example, at least one of HMDS (hexamethyldisilazane), TMS (tetramethylsilane), fluorinated alkylchlorosilane, alkyldisilazane, and a non-chloro-based first chemical liquid. The non-chloro-based first chemical liquid includes, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and an organosilane compound. The first chemical liquid for metal is, for example, a solvent having a high coordinating property and hydrophobizes a metal mainly by coordination bonds. The first chemical liquid includes, for example, at least one of an amine, having a hydrophobic group, or an organosilicon compound.

As examples of the organic solvent, IPA (isopropyl alcohol), methanol, ethanol, acetone, EG (ethylene glycol), and HFE (hydrofluoroether) can be cited. Also, the organic solvent may not only be that which is constituted of just a single component but may also be a liquid mixed with another component. For example, the organic solvent may be a mixed liquid of IPA and acetone or a mixed liquid of IPA and methanol.

The water is any of pure water (deionized water), carbonated water, electrolyzed ion water, hydrogen water, ozone water, and ammonia water of dilute concentration (of, for example, approximately 10 to 100 ppm).

The processing liquid supplied from each of the processing liquid supplying units 8, 9, 10, and 11 may be one type or may be of a plurality of types.

As shown in FIG. 2, the processing cup 12 is disposed further outward (in a direction away from the rotational axis A1) than the substrate W held by the spin chuck 5. The processing cup 12 surrounds a periphery of the spin base 18. When a processing liquid is supplied to the substrate W in a state where the spin chuck 5 is rotating the substrate W, the processing liquid supplied to the substrate W is spun off to a periphery of the substrate W. When the processing liquid is supplied to the substrate W, an upper end portion 12a of the upwardly open processing cup 12 is disposed higher than the spin base 18. The processing liquid (chemical liquid or rinse liquid) expelled to the periphery of the substrate W is thus received by the processing cup 12. The processing liquid received by the processing cup 12 is fed to an unillustrated recovery apparatus or waste liquid apparatus.

Figure 5A:
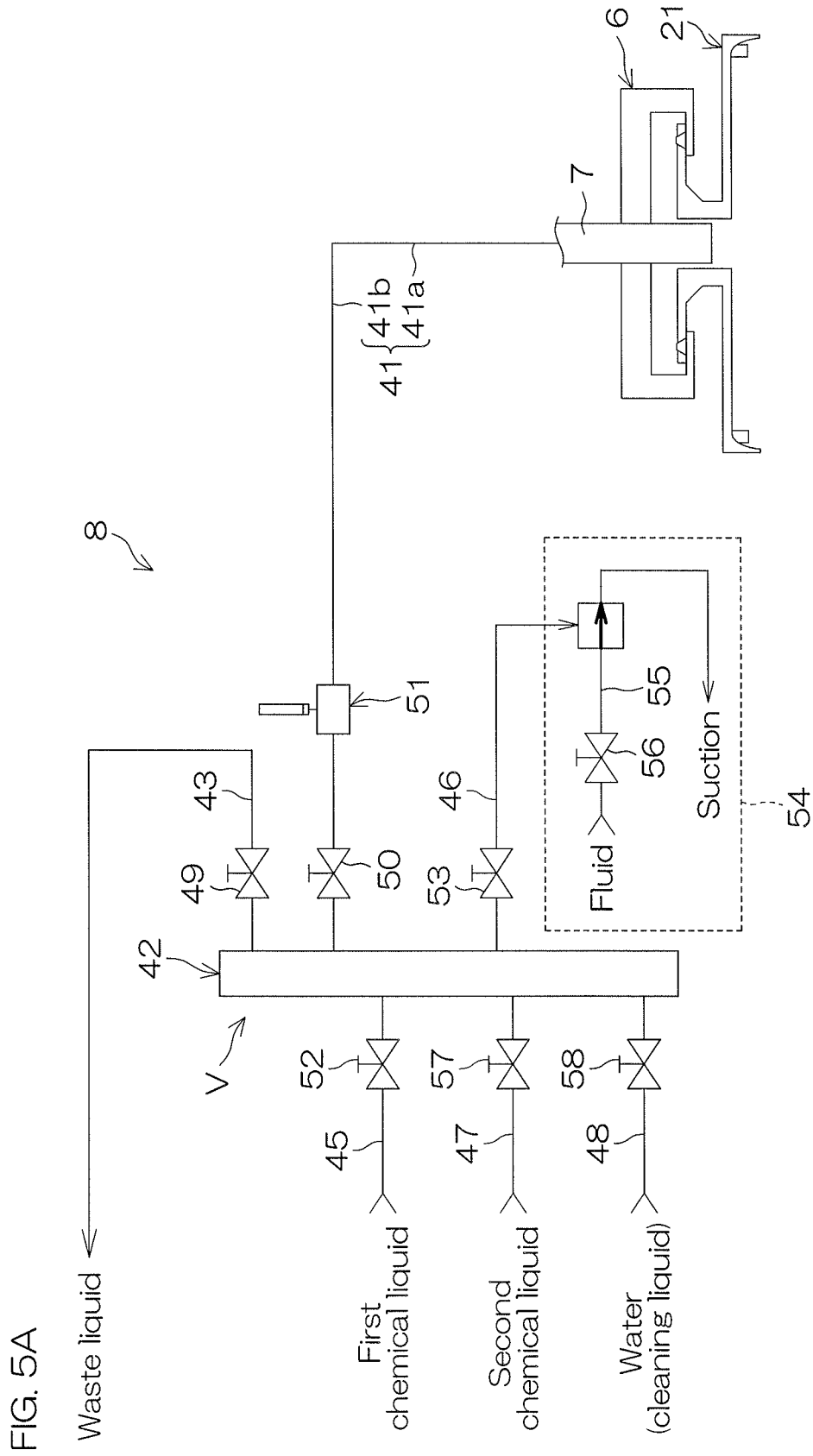
FIG. 5A is a diagram for describing an arrangement of a first processing liquid supplying unit shown in FIG. 2.

FIG. 5A is a diagram for describing an arrangement of the first processing liquid supplying unit 8.

The first processing liquid supplying unit 8 includes a common piping 41, connected to the first nozzle piping 31, and a valve unit V, connected to the first nozzle piping 31 via the common piping 41. The valve unit V includes a connection portion 42, feeding liquid to the first nozzle piping 31, and a plurality of valves 49, 50, 52, 53, 57, and 58. All of these valves 49, 50, 52, 53, 57, and 58 are on-off valves. The valve unit V includes a drain piping 43, a first chemical liquid supplying piping (chemical liquid supplying piping) 45, a suction piping 46, a second chemical liquid supplying piping (chemical liquid supplying piping) 47, and a cleaning liquid supplying piping 48 that are respectively connected to the connection portion 42. An interior of the common piping 41 is in communication with the first discharge port 31a (see FIG. 3 and FIG. 4).

Figure 5B:
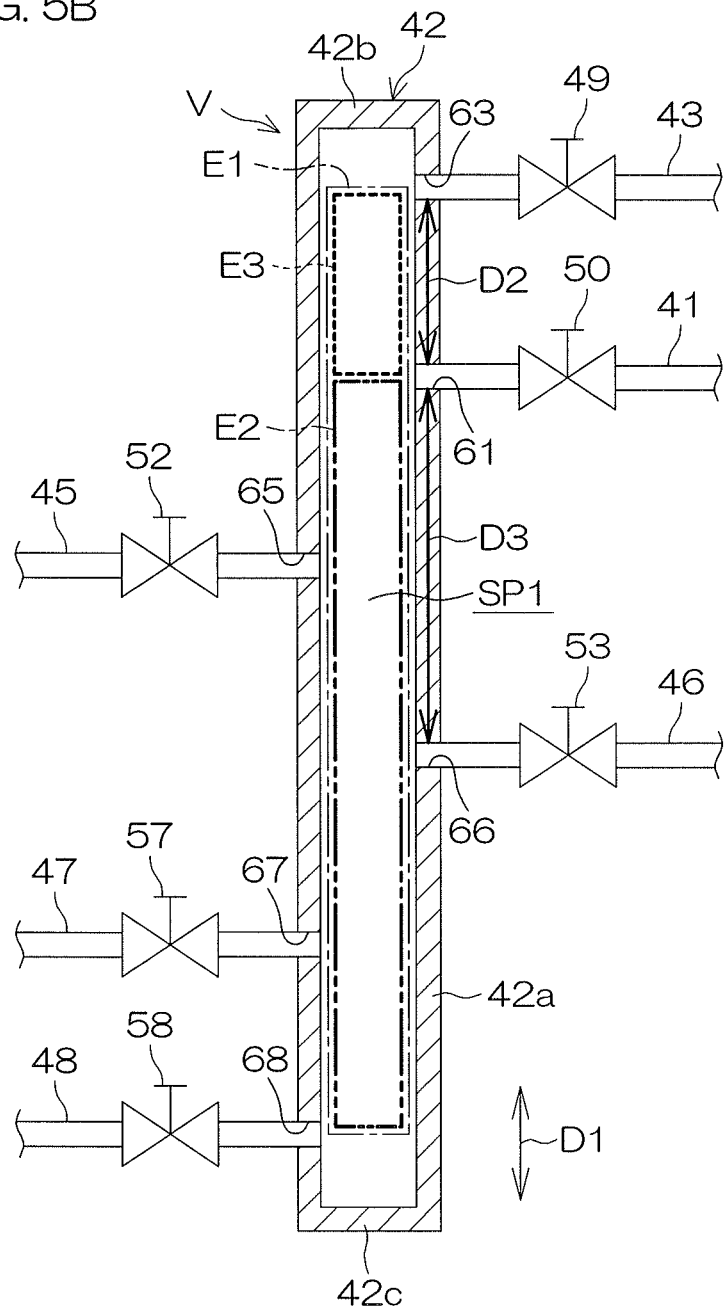
FIG. 5B is a diagram for describing an arrangement of a valve unit shown in FIG. 5A.

FIG. 5B is a diagram for describing an arrangement of the valve unit V.

The connection portion 42 has a longitudinal side oriented along a predetermined single direction (a flow direction D1 described next). The connection portion 42 includes a cylindrical side wall 42a, extending in the flow direction D1, one end wall 42b, closing an end portion at one side of the side wall 42a, and another end wall 42c, closing an end portion at another side of the side wall 42a. A flow space SP1 for a liquid to flow through is formed in an interior of the connection portion 42. The flow space SP1 extends along the flow direction D1.

In FIG. 5B, the connection portion 42 is disposed such that the one end wall 42b faces upward and the flow direction D1 extends up and down. The flow direction D1 does not have to extend up and down. Also, the one end wall 42b may be disposed to face downward.

The side wall 42a of the connection portion 42 has a cylindrical shape. The cylindrical shape is a circular cylindrical shape or a rectangular cylindrical shape. A cross section of the side wall 42a of the connection portion 42 is equal across its entirety in the flow direction D1. Ports (connection ports) for piping connection are formed on the side wall 42a of the connection portion 42. The ports include, from one side (upper side of FIG. 5B), a drain port 63, a common port 61, a first chemical liquid supplying port 65, a suction port 66, a second chemical liquid supplying port 67, and a cleaning liquid supplying port 68. The drain port 63 is a port connected to an upstream end of the drain piping 43. The common port 61 is a port connected to an upstream end of the common piping 41. The first chemical liquid supplying port 65 is a port connected to a downstream end of the first chemical liquid supplying piping 45. The suction port 66 is a port connected to an upstream end of the suction piping 46. The second chemical liquid supplying port 67 is a port connected to a downstream end of the second chemical liquid supplying piping 47. The cleaning liquid supplying port 68 is a port connected to a downstream end of the cleaning liquid supplying piping 48. The drain port 63, the common port 61, the first chemical liquid supplying port 65, the suction port 66, the second chemical liquid supplying port 67, and the cleaning liquid supplying port 68 are disposed at intervals (for example, equal intervals) from each other in that order from the one side (upper side of FIG. 5B) in regard to the flow direction D1. Peripheral direction positions of the drain port 63, the common port 61, the first chemical liquid supplying port 65, the suction port 66, the second chemical liquid supplying port 67, and the cleaning liquid supplying port 68 may be mutually aligned or that of at least one port may differ from those of other ports.

As shown in FIG. 5B, the drain port 63 is the port at one endmost (upper end of FIG. 5B) side in the flow direction D1 of the side wall 42a, and the cleaning liquid supplying port 68 is the port at another endmost (lower end of FIG. 5B) side in the flow direction D1 of the side wall 42a. In this case, a proportion that a volume of a region (hereinafter referred to as the "drain-cleaning liquid supplying region") E1 (illustrated by alternate long and short dashed lines in FIG. 5B) in the flow space SP1 between the drain port 63 and the cleaning liquid supplying port 68 occupies in a volume of the entire flow space SP1 is large. Also, from another viewpoint, the common port 61 is disposed between the drain port 63 and the cleaning liquid supplying port 68 in regard to the flow direction D1. That is, a region (hereinafter referred to as the "common-cleaning liquid supplying region") E2 (illustrated by alternate long and two short dashed lines in FIG. 5B) in the flow space SP1 between the common port 61 and the cleaning liquid supplying port 68 is included in a path leading from the cleaning liquid supplying port 68 to the drain port 63.

Also, a distance D2 between the common port 61 and the drain port 63 is narrower than a distance D3 between the common port 61 and the cleaning liquid supplying port 68. In other words, a volume of a region (hereinafter referred to as the "common-drain region") E3 (illustrated by broken lines in FIG. 5B) in the flow space SP1 between the common port 61 and the drain port 63 is less than a volume of the common-cleaning liquid supplying region E2. Also, in other words, the volume of the common-cleaning liquid supplying region E2 is greater than the volume of the common-drain region E3. That is, not just the proportion that the volume of the drain-cleaning liquid supplying region E1 occupies in the volume of the entire flow space SP1 but the proportion that the volume of the common-cleaning liquid supplying region E2 occupies in the volume of the entire flow space SP1 is also large.

Referring to FIG. 5A again, the common piping 41 includes an up/down direction portion 41a and a right/left direction portion 41b. A downstream end of the up/down direction portion 41a is connected to an upstream end of the first nozzle piping 31. A downstream end of the right/left direction portion 41b is connected to an upstream end of the up/down direction portion 41a. An upstream end of the right/left direction portion 41b is connected to the connection portion 42. A common valve 50, arranged to open and close the common piping 41, is interposed in the right/left direction portion 41b of the common piping 41. The common valve 50 is an air-operated on-off valve. A diaphragm valve, a butterfly valve, a needle valve, etc., can be cited as examples of such an air-operated on-off valve.

In the right/left direction portion 41b of the common piping 41, a first suction apparatus 51 is interposed further downstream than the common valve 50. The first suction apparatus 51 is a diaphragm type suction apparatus. The diaphragm type suction apparatus includes a cylindrical head, interposed in an intermediate portion of the common piping 41, and a diaphragm, housed inside the head, and is a suction apparatus such that a volume of a flow passage formed inside the head is changed by driving of the diaphragm (see Japanese Patent Application Publication No. 2016-111306).

The first suction apparatus 51 constituted of the diaphragm type suction apparatus is an air-operated suction apparatus. Air is supplied to an interior of the first suction apparatus 51. The diaphragm is thereby changed in shape and the volume inside the head increases and consequently, the first chemical liquid, present at a portion of the common piping 41 at a further downstream side than the first suction apparatus 51 is drawn inside the head and the first chemical liquid contained in an interior of the downstream side portion is suctioned. A function of the first suction apparatus 51 is thereby made effective.

A driving source (for example, a solenoid valve) arranged to drive the common valve 50 and a driving source (for example, a solenoid valve) arranged to drive the first suction apparatus 51 are mutually independent. If the driving source arranged to drive the common valve 50 and the driving source arranged to drive the first suction apparatus 51 are in common, suction/suction release of the first suction apparatus 51 would be performed in linkage with the opening/closing of the common valve 50. The opening/closing of the common valve 50 and the suction/suction release of the first suction apparatus 51 can be performed respectively at mutually optimal timings because the driving source arranged to drive the common valve 50 and the driving source arranged to drive the first suction apparatus 51 are mutually independent.

A drain valve 49, arranged to open and close the drain piping 43, is interposed in the drain piping 43. A downstream end side of the drain piping 43 is connected to an external waste liquid equipment.

A first chemical liquid supplying valve 52, arranged to open and close the first chemical liquid supplying piping 45 is interposed in the first chemical liquid supplying piping 45. The first chemical liquid from a first chemical liquid supplying source is arranged to be supplied to an upstream end side of the first chemical liquid supplying piping 45.

A suction valve 53, arranged to open and close the suction piping 46, is interposed in the suction piping 46. A second suction apparatus 54 is connected to a downstream end side of the suction piping 46. The second suction apparatus 54 is an ejector type suction apparatus. The ejector type suction apparatus includes a vacuum generator and an aspirator. The ejector type suction apparatus is stronger in suction force (faster in suction speed) and greater in flow rate of liquid that can be suctioned in comparison to a diaphragm type suction apparatus or a siphon type suction apparatus.

The second suction apparatus 54 includes a fluid supplying piping 55 and a fluid supplying valve 56, arranged to switch between opening and closing of the fluid supplying piping 55. The fluid supplying valve 56 is, for example, a solenoid valve. By the fluid supplying valve 56 being opened and a fluid flowing inside the fluid supplying piping 55 in an energized state of the second suction apparatus 54, an interior of the second suction apparatus 54 is depressurized. An interior of the suction piping 46 is thereby suctioned. That is, a function of the second suction apparatus 54 is made effective.

A second chemical liquid supplying valve 57, arranged to open and close the second chemical liquid supplying piping 47 is interposed in the second chemical liquid supplying piping 47. A second chemical liquid from a second chemical liquid supplying source is arranged to be supplied to an upstream end side of the second chemical liquid supplying piping 47. The second chemical liquid is a chemical liquid differing in type from the first chemical liquid.

A cleaning liquid supplying valve 58 arranged to open and close the cleaning liquid supplying piping 48 is interposed in the cleaning liquid supplying piping 48. A cleaning liquid from a cleaning liquid supplying source is arranged to be supplied to an upstream end side of the cleaning liquid supplying piping 48. The cleaning liquid is, for example, water. As mentioned above, the water is any of pure water (deionized water), carbonated water, electrolyzed ion water, hydrogen water, ozone water, and ammonia water of dilute concentration (of, for example, approximately 10 to 100 ppm).

When the first chemical liquid supplying valve 52 and the common valve 50 are opened in a state where the other valves in the first processing liquid supplying unit 8 are closed, the first chemical liquid from the first chemical liquid supplying piping 45 flows into the interior of the connection portion 42, the first chemical liquid is supplied to the first nozzle piping 31 via the common piping 41, and the first chemical liquid is discharged downward from the first discharge port 31a.

Also, when the first chemical liquid supplying valve 52 and the drain valve 49 are opened in a state where the other valves in the first processing liquid supplying unit 8 are closed, the first chemical liquid from the first chemical liquid supplying piping 45 flows into the connection portion 42 and the first chemical liquid is drained out of the connection portion 42 through the drain piping 43 (pre-dispensing of the first chemical liquid).

Also, when the second chemical liquid supplying valve 57 and the common valve 50 are opened in a state where the other valves in the first processing liquid supplying unit 8 are closed, the second chemical liquid from the second chemical liquid supplying piping 47 flows into the connection portion 42, the second chemical liquid is supplied to the first nozzle piping 31 via the common piping 41, and the second chemical liquid is discharged downward from the first discharge port 31a.

Also, when the second chemical liquid supplying valve 57 and the drain valve 49 are opened in a state where the other valves in the first processing liquid supplying unit 8 are closed, the second chemical liquid from the second chemical liquid supplying piping 47 flows into the connection portion 42 and the second chemical liquid is drained out of the connection portion 42 through the drain piping 43 (pre-dispensing of the second chemical liquid).

Also, when the cleaning liquid supplying valve 58 and the drain valve 49 are opened in a state where the other valves in the first processing liquid supplying unit 8 are closed, the cleaning liquid from the cleaning liquid supplying piping 48 flows into the connection portion 42 and the cleaning liquid is drained out of the connection portion 42 through the drain piping 43 (connection portion cleaning step).

In the connection portion cleaning step, the proportion that the volume of the drain-cleaning liquid supplying region E1 occupies in the volume of the entire flow space SP1 is large. Also, the common-cleaning liquid supplying region E2 is included in the path leading from the cleaning liquid supplying port 68 to the drain port 63. Therefore, in the connection portion cleaning step, the cleaning liquid can be made to flow through the common-cleaning liquid supplying region E2 satisfactorily and consequently, a chemical liquid (the first chemical liquid or the second chemical liquid) can be forced out satisfactorily from the common-cleaning liquid supplying region E2 by the cleaning liquid.

Also, the volume of the common-cleaning liquid supplying region E2 is greater than the volume of the common-drain region E3. That is, not just the proportion that the volume of the drain-cleaning liquid supplying region E1 occupies in the volume of the entire flow space SP1 but the proportion that the volume of the common-cleaning liquid supplying region E2 occupies in the volume of the entire flow space SP1 is also large. The chemical liquid can thus be forced out satisfactorily from the flow space SP1 both when draining the cleaning liquid, supplied from the cleaning liquid supplying piping 48 to the connection portion 42, to the drain piping 43 and when supplying the cleaning liquid, supplied from the cleaning liquid supplying piping 48 to the connection portion 42, to the common piping 41.

Such a connection portion cleaning step is performed for the following reason. That is, in cleaning an interior of the flow space SP1 of the connection portion 42, it may be considered to drain the cleaning liquid or the chemical liquid (the first chemical liquid or the second chemical liquid) forced out by the cleaning liquid from the first discharge port 31a via the common piping 41. However, if the first discharge port 31a is provided to be immovable in the direction along the upper surface of the substrate W held by the spin chuck 5, the cleaning liquid or the chemical liquid discharged from the first discharge port 31a may be supplied to the upper surface of the substrate W. It may thus not be possible to perform a connection portion cleaning step of a method where the cleaning liquid, etc., is discharged from the first discharge port 31a or restriction may be applied in performing the connection portion cleaning step.

Also, when the common valve 50 and the suction valve 53 are opened in a state where the other valves in the first processing liquid supplying unit 8 are closed and the function of the second suction apparatus 54 is made effective, the interior of the common piping 41 is evacuated and a leading end surface of a liquid (the cleaning liquid or the chemical liquid) recedes in the interior of the common piping 41. The liquid present in the interior of the common piping 41 and the flow space SP1 of the connection portion 42 is thereby removed by suction from the interior of the common piping 41 and the flow space SP1 of the connection portion 42.

Although description of the second to fourth processing liquid supplying units 9 to 11 shall be omitted, these have the same arrangement as the first processing liquid supplying unit 8. Also, the processing liquids supplied from the respective processing liquid supplying units 8 to 11 may be of one type or may be of a plurality of types.

Figure 6:
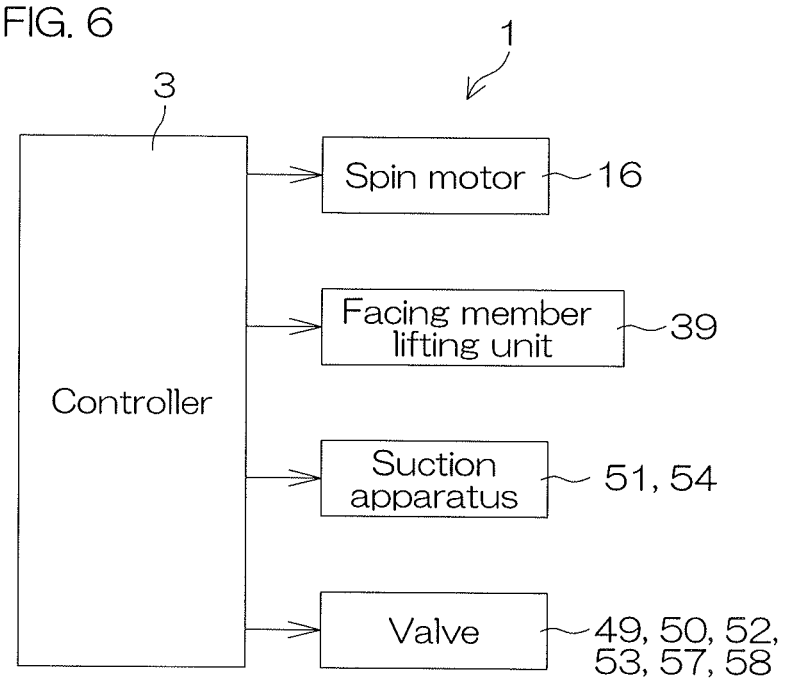
FIG. 6 is a block diagram for describing an electrical configuration of a main portion of the substrate processing apparatus.

FIG. 6 is a block diagram for describing an electrical configuration of a main portion of the substrate processing apparatus 1.

The controller 3 is arranged using, for example, a microcomputer. The controller 3 has a computing unit, such as CPU, etc., a storage unit, such as a fixed memory device, a hard disk drive, etc., and an input/output unit. A program executed by the computing unit is stored in the storage unit.

Also, the spin motor 16, the facing member lifting unit 39, the first suction apparatus 51, and the second suction apparatus 54, etc., are connected as control objects to the controller 3. The controller 3 controls operations of the spin motor 16, the first suction apparatus 51, and the second suction apparatus 54, etc., in accordance with a predetermined program. Also, the controller 3 opens and closes the drain valve 49, the common valve 50, the first chemical liquid supplying valve 52, the suction valve 53, the second chemical liquid supplying valve 57, the cleaning liquid supplying valve 58, etc., in accordance with the predetermined program.

Figure 7:
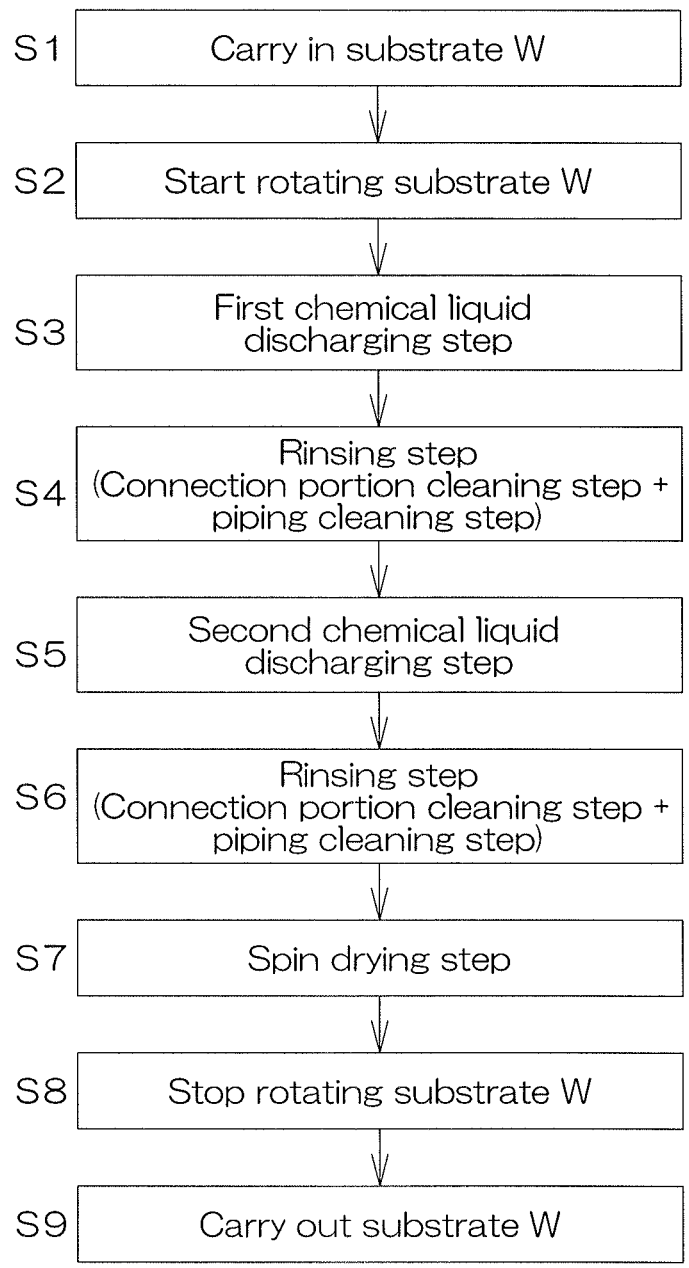
FIG. 7 is a flowchart for describing contents of an example of substrate processing executed in the processing unit.
Figure 8:
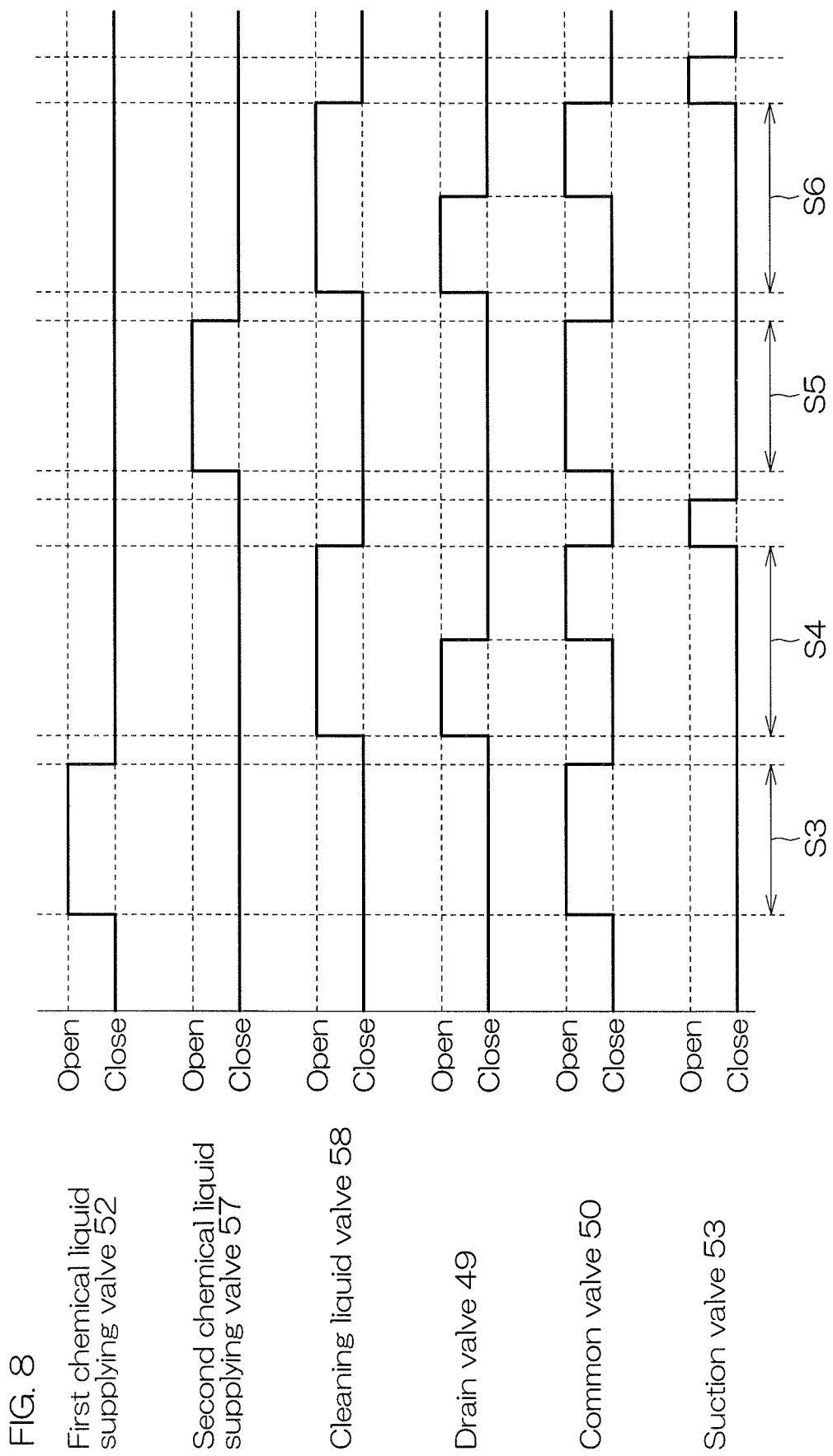
FIG. 8 is a timing chart for describing main control contents of a controller in the substrate processing example.
Figure 9:
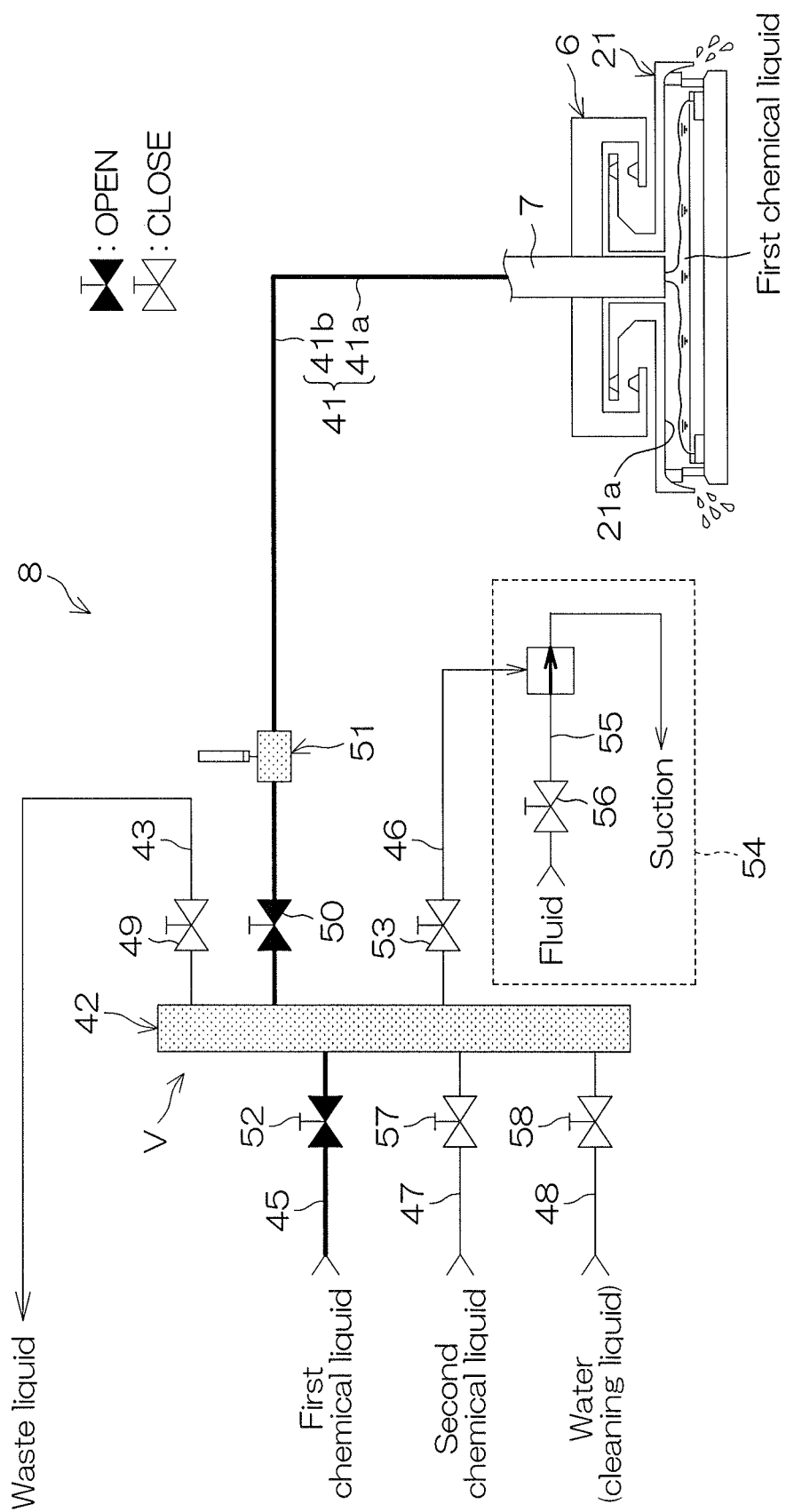
FIG. 9 is a diagram for describing a first chemical liquid discharging step shown in FIG. 7.
Figure 10:
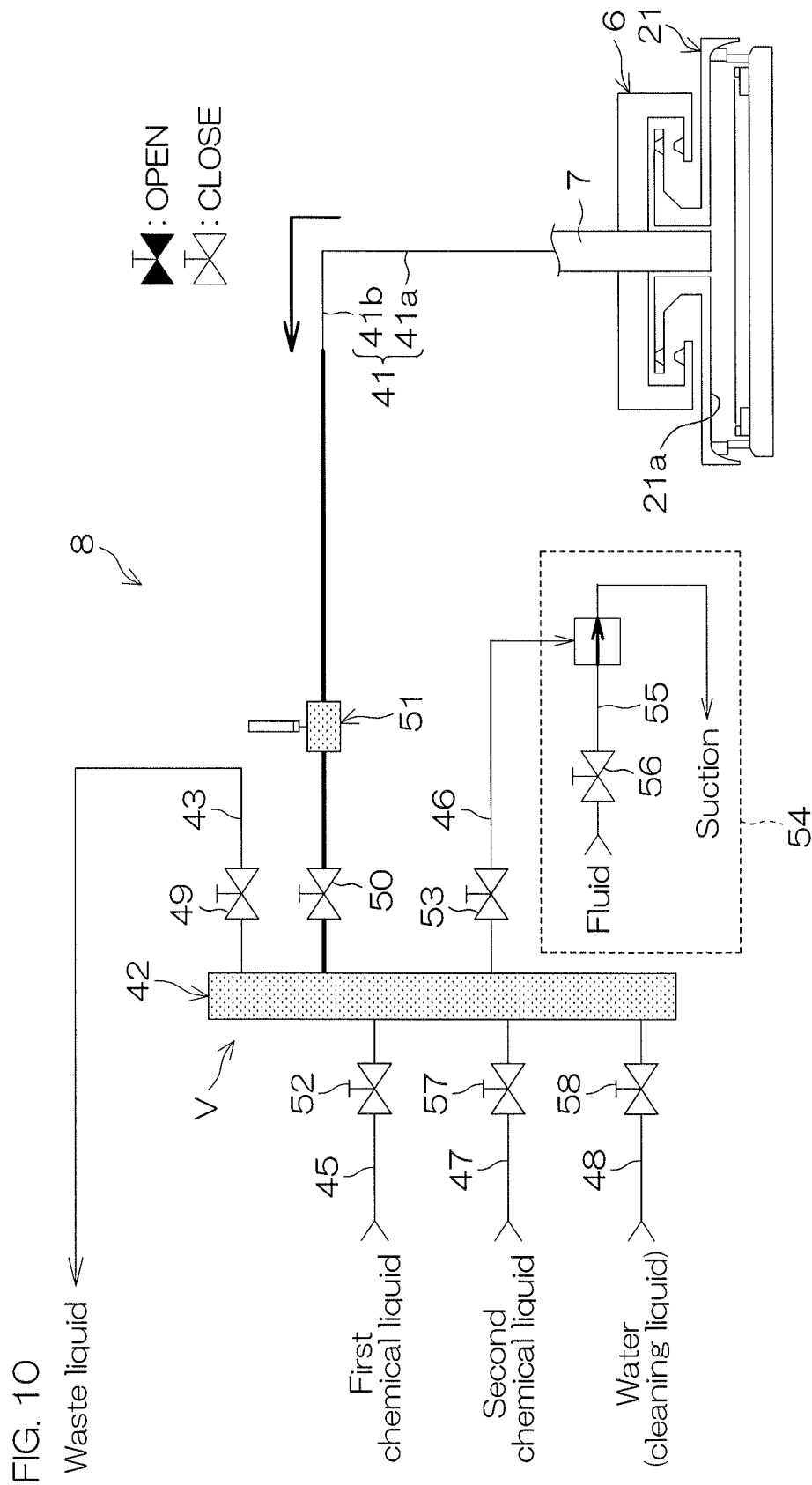
FIG. 10 is a diagram for describing suctioning performed after the first chemical liquid discharging step.
Figure 11:
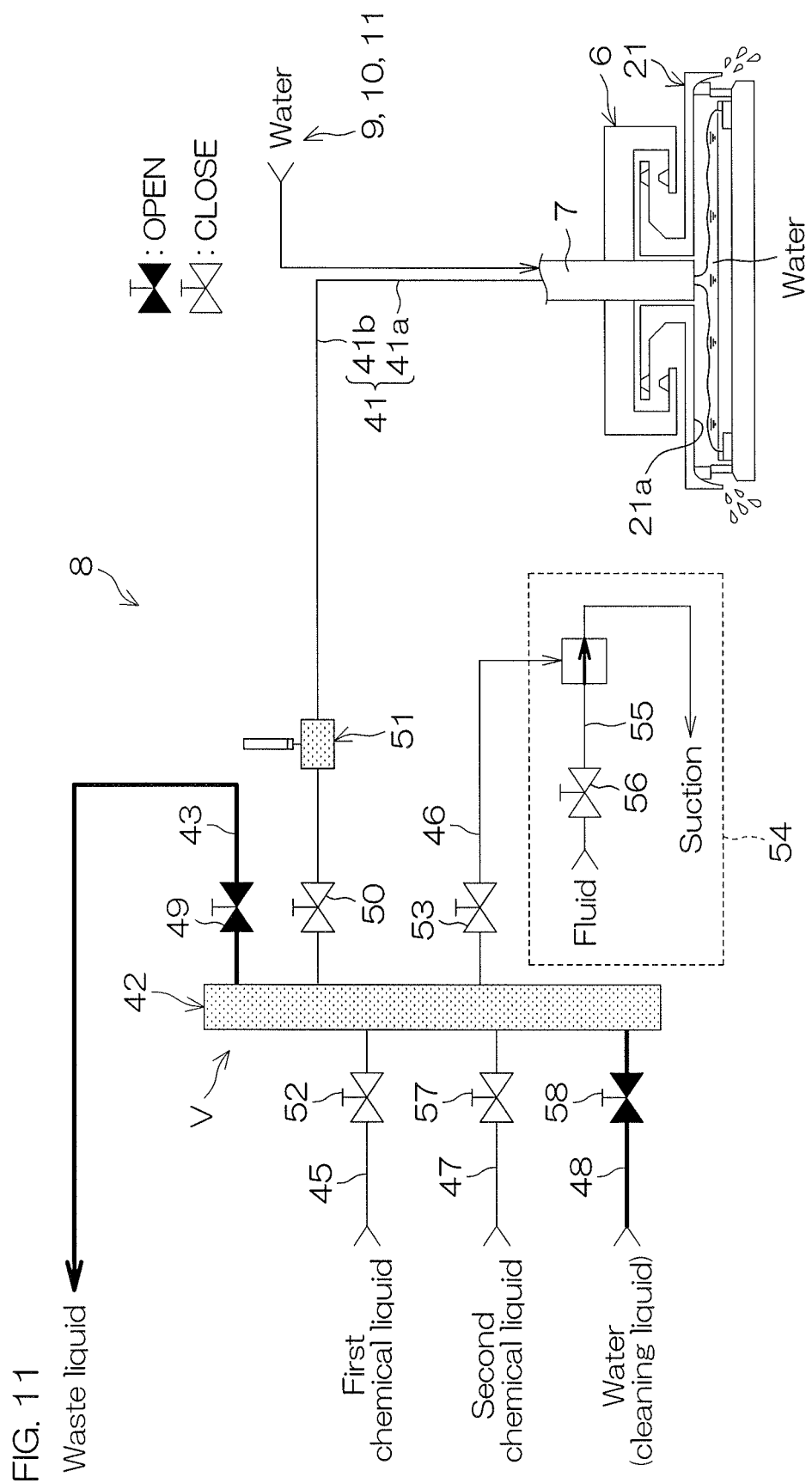
FIG. 11 is a diagram for describing a rinsing step.
Figure 12:
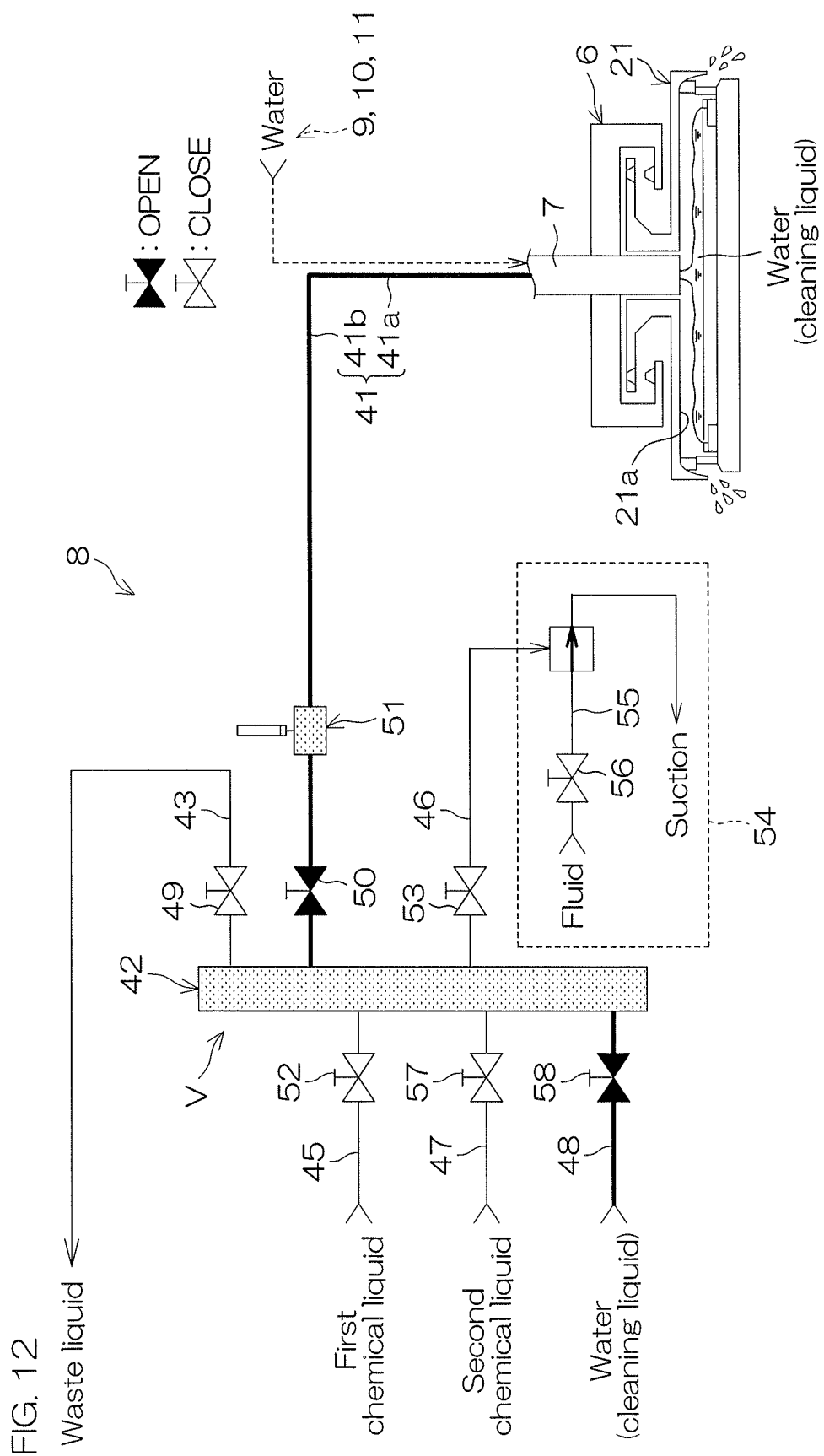
FIG. 12 is a diagram for describing a state subsequent that of FIG. 11 in the rinsing step.
Figure 13:
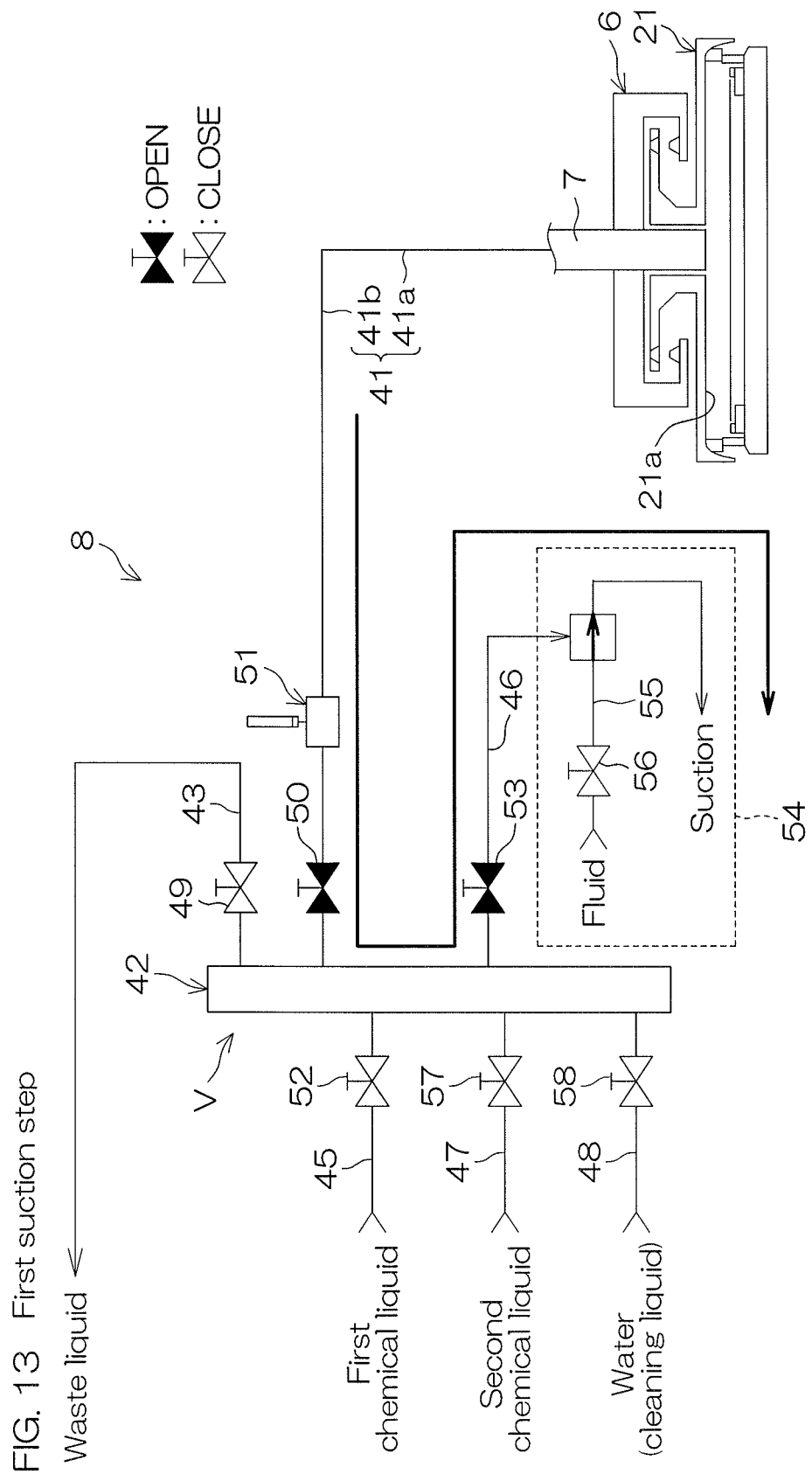
FIG. 13 is a diagram for describing a suctioning step performed after the rinsing step.
Figure 14:
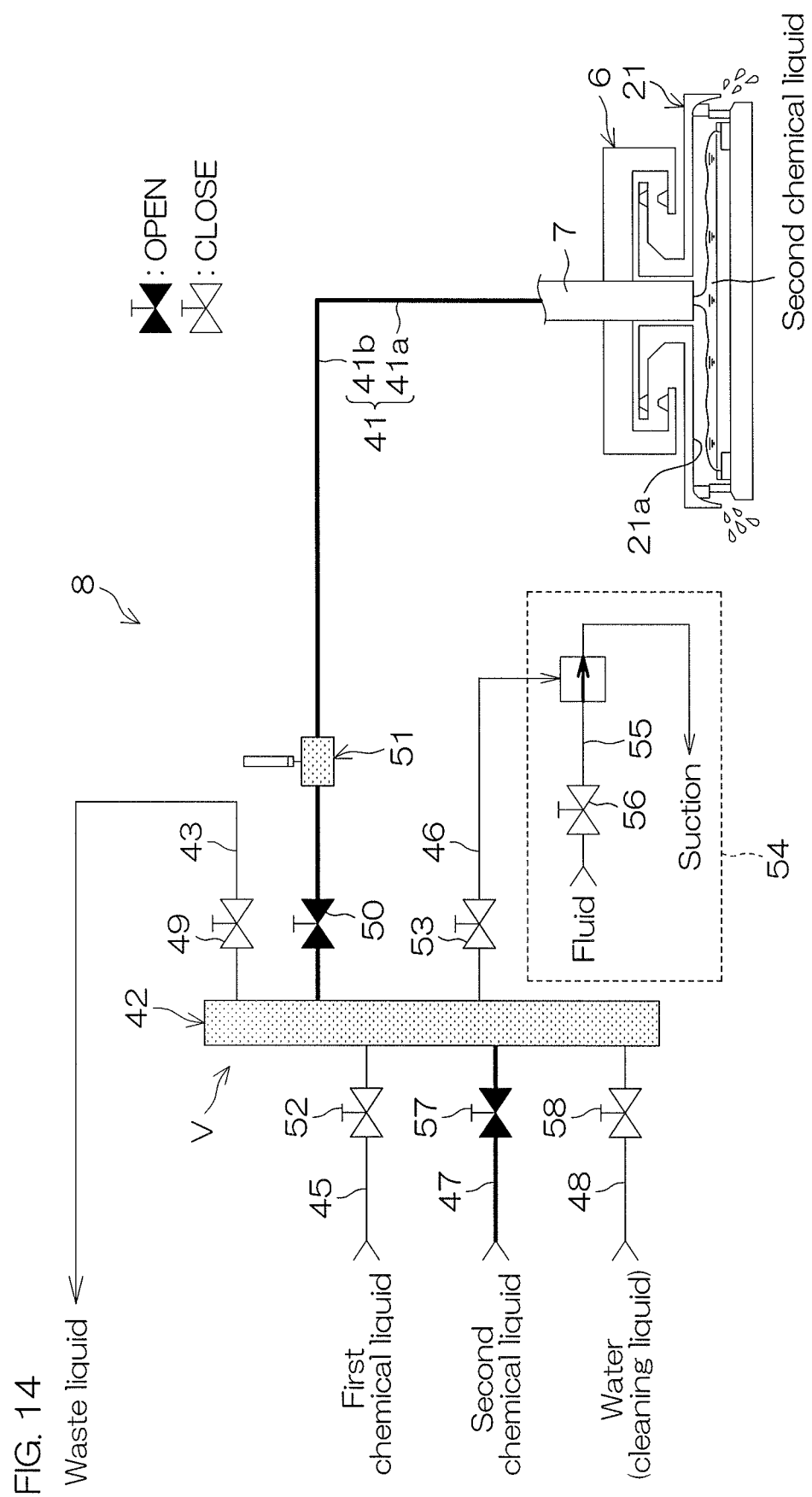
FIG. 14 is a diagram for describing suctioning performed after the first chemical liquid discharging step.

FIG. 7 is a flowchart for describing contents of an example of substrate processing executed in the processing unit 2. FIG. 8 is a timing chart for describing main control contents of the controller 3 in the substrate processing example. FIG. 9 is a diagram for describing a first chemical liquid discharging step S3. FIG. 10 is a diagram for describing suctioning performed after the first chemical liquid discharging step S3. FIG. 11 and FIG. 12 are diagrams for describing a rinsing step S4. FIG. 13 is a diagram for describing a first suctioning step performed after the rinsing step S4. FIG. 14 is a diagram for describing suctioning performed after the first chemical liquid discharging step S3.

The substrate processing example executed in the processing unit 2 shall now be described with reference to FIG. 7 and FIG. 8. FIG. 10 to FIG. 14 shall be referenced where appropriate. Also, the substrate processing example may be an etching processing or may be a cleaning processing.

If a long period has elapsed from the end of a previous processing using the first chemical liquid in the processing unit 2, the first chemical liquid present in an interior of the first chemical liquid supplying piping 45 may be deactivated (degraded) or lowered in temperature. Also, if a long period has elapsed from the end of a previous processing using the second chemical liquid in the processing unit 2, the second chemical liquid present in an interior of the second chemical liquid supplying piping 47 may be deactivated (degraded) or lowered in temperature.

Pre-dispensing for draining the first chemical liquid present in the interior of the first chemical liquid supplying piping 45 or draining the second chemical liquid present in the interior of the second chemical liquid supplying piping 47 is thus executed as necessary before executing the substrate processing. The chemical liquid that is deactivated (degraded) or lowered in temperature can thereby be prevented from being used in the substrate processing.

Specifically, to perform the pre-dispensing of the first chemical liquid, the controller 3 opens the first chemical liquid supplying valve 52 and the drain valve 49 in the state where the other valves in the first processing liquid supplying unit 8 are closed. Thereby, the first chemical liquid from the first chemical liquid supplying piping 45 flows into the connection portion 42 and is drained out of the connection portion 42 through the drain piping 43. Also, to perform the pre-dispensing of the second chemical liquid, the controller 3 opens the second chemical liquid supplying valve 57 and the drain valve 49 in the state where the other valves in the first processing liquid supplying unit 8 are closed. Thereby, the second chemical liquid from the second chemical liquid supplying piping 47 flows into the connection portion 42 and is drained out of the connection portion 42 through the drain piping 43.

When the substrate processing is to be executed, an unprocessed substrate W is carried into an interior of the chamber 4 (S1 of FIG. 7). By making a hand H of the transfer robot CR, which holds the substrate W, enter into the interior of the chamber 4, the substrate W, specifically with its front surface (device forming surface) faced upward, is passed onto the spin chuck 5. Thereafter, the substrate W is held by the spin chuck 5 (substrate holding). The carrying of the substrate W into the chamber 4 is performed in a state in which the shielding plate 21 is disposed at the retreat position.

Thereafter, the controller 3 controls the spin motor 16 to start rotation of the substrate W (S2 of FIG. 7). The substrate W is raised to a predetermined liquid processing speed (within a range of approximately 10 to 1200 rpm and, for example, of approximately 1000 rpm) and maintained at the liquid processing speed.

Also, the controller 3 controls the facing member lifting unit 39 to dispose the shielding plate 21 at the proximity position. In this state, the first chemical liquid discharging step S3 (see FIG. 7) is executed.

Specifically, the controller 3 opens the first chemical liquid supplying valve 52 and the common valve 50 while closing the other valves in the first processing liquid supplying unit 8 as shown in FIG. 9. By the opening of the first chemical liquid supplying valve 52 and the common valve 50, the first chemical liquid is discharged toward the upper surface central portion of the substrate W from the first discharge port 31*a* formed on the substrate facing surface 21*a* of the shielding plate 21. The first chemical liquid supplied to the upper surface of the substrate W moves to a peripheral edge portion of the substrate W by receiving a centrifugal force due to the rotation of the substrate W. The entirety of the upper surface of the substrate W is thereby processed using the first chemical liquid.

When, in the first chemical liquid discharging step S3, a predetermined period elapses from the start of discharge of the first chemical liquid from the first discharge port 31*a*, the controller 3 closes the common valve 50 and the first chemical liquid supplying valve 52 as shown in FIG. 10. The discharge of the first chemical liquid from the first discharge port 31*a* is thereby stopped and the first chemical liquid discharging step S3 ends. At this point, the first chemical liquid is present in the entirety of the flow space SP1 of the connection portion 42.

After the discharge of the first chemical liquid is stopped, the controller 3 makes the first suction apparatus 51 be driven in the state where the common valve 50 is kept closed to suction the first chemical liquid further downstream in the common piping 41 than the first suction apparatus 51. A suction amount of the first chemical liquid in this process is 1 to several milliliters. A leading end surface of the first chemical liquid inside the common piping 41 is thereby made to recede to a predetermined standby position set in the right/left direction portion 41*b* as shown in FIG. 10. By the receding of the leading end surface of the first chemical liquid, dripping of the first chemical liquid from the first discharge port 31*a* can be prevented reliably.

Next, the controller 3 performs the rinsing step S4 (see FIG. 7) of supplying a rinse liquid to the upper surface of the substrate W. The rinsing step S4 includes a connection portion cleaning step (first cleaning step), executed in an initial stage of the rinsing step S4, and a piping cleaning step (third cleaning step), executed following the end of the connection portion cleaning step.

In the connection portion cleaning step, the controller 3 opens the cleaning liquid supplying valve 58 and the drain valve 49 in the state where the other valves in the first processing liquid supplying unit 8 are closed as shown in FIG. 11. Thereby, the water from the cleaning liquid supplying piping 48 flows from the cleaning liquid supplying port 68 into the flow space SP1 of the connection portion 42 and the water flows through the flow space SP1 and is guided out to the drain piping 43 from the drain port 63. The first chemical liquid present in the flow space SP1 of the connection portion 42 can thereby be forced out of the connection portion 42 using the water.

When a predetermined period (for example, 2 to 3 seconds) elapses from the opening of the cleaning liquid supplying valve 58 and the drain valve 49, the piping cleaning step is executed next.

Specifically, in the piping cleaning step, the controller 3 closes the drain valve 49 and opens the common valve 50 while keeping the cleaning liquid supplying valve 58 open as shown in FIG. 12. The water flowing into the connection portion 42 is thus guided into the common piping 41. The water guided into the common piping 41 is supplied to the first nozzle piping 31 through the interior of the common piping 41 and is discharged from the first discharge port 31a. By the water flowing through the interior of the common piping 41, the interior of the common piping 41 is cleaned by the water (piping cleaning step). Also, in parallel to the piping cleaning step, water supplied from another processing liquid supplying unit (any of the second to fourth processing liquid supplying units 9 to 11) is discharged from another discharge port.

The water supplied to the upper surface of the substrate W moves to the peripheral edge portion of the substrate W by receiving the centrifugal force due to the rotation of the substrate W. The chemical liquid is thereby replaced by the water across the entirety of the upper surface of the substrate W. In the piping cleaning step, water supplied from another processing liquid supplying unit (any of the second to fourth processing liquid supplying units 9 to 11) may be discharged or does not have to be discharged from another discharge port (among the second to fourth discharge ports 31b to 31d).

Since water is adopted as the cleaning liquid, a rinse processing can be applied to the upper surface of the substrate W using the water from the cleaning liquid supplying piping 48 in the piping cleaning step. Switching from the connection portion cleaning step to the piping cleaning step is accomplished by closing the drain valve 49 and opening the common valve 50 while keeping the cleaning liquid supplying valve 58 open and therefore the piping cleaning step can be started in succession to the end of the connection portion cleaning step. Shortening of processing time can thereby be achieved. Also, the piping cleaning step is performed after the connection portion cleaning step and therefore the chemical liquid is hardly contained in the water supplied from the first discharge port 31a to the upper surface of the substrate W. Supplying of the chemical liquid to the upper surface of the substrate W in the piping cleaning step can thereby be suppressed or prevented.

When a predetermined period elapses from the start of discharge of the rinse liquid from the first discharge port 31a in the rinsing step S4, the controller 3 closes the common valve 50 and the cleaning liquid supplying valve 58. The discharge of water from the first discharge port 31a is thereby stopped and the rinsing step S4 ends.

When the rinsing step S4 ends (the piping cleaning step ends), the first suctioning step, shown in FIG. 13, is executed next.

In the first suctioning step, the controller 3 opens the common valve 50 and the suction valve 53 in the state where the other valves in the first processing liquid supplying unit 8 are closed as shown in FIG. 13. The interior of the suction piping 46 and the flow space SP1 of the connection portion 42 are thereby evacuated and the water remaining in the interior of the common piping 41 is drawn into the suction piping 46 through the flow space SP1 of the connection portion 42. When all of the water is drained from the interior of the common piping 41 and the interior of the flow space SP1 of the connection portion 42, the controller 3 closes the suction valve 53 and the common valve 50. By the first suctioning step, the water used for cleaning can be drained from the interior of the common piping 41 and the flow space SP1 of the connection portion 42.

After the end of the piping cleaning step, all of the liquid present in the interior of the common piping 41 and the flow space SP1 of the connection portion 42 is suctioned. All of the water can thus be drained from the interior of the common piping 41 and the flow space SP1 of the connection portion 42 and remaining of water in the flow space SP1 after the connection portion cleaning step can thereby be prevented.

Also, with the present preferred embodiment, the first suctioning step is executed not immediately after the connection portion cleaning step but after the piping cleaning step. That is, the water present in the interior of the common piping 41 after cleaning (water that does not contain any chemical liquid at all) is suctioned. Contamination of the flow space SP1 of the connection portion 42 by the suctioned water can thus be prevented reliably.

Also, in the first suctioning step, all of the water can be drained from the interior of the common piping 41 and the flow space SP1 of the connection portion 42 and the draining operation can be performed in a short period because the first suctioning step is performed using the second suction apparatus 54 that is constituted of an ejector type suction apparatus.

Next, a second chemical liquid discharging step S5 (see FIG. 7) is executed. Specifically, the controller 3 opens the second chemical liquid supplying valve 57 and the common valve 50 while closing the other valves in the first processing liquid supplying unit 8 as shown in FIG. 14. By the opening of the second chemical liquid supplying valve 57 and the common valve 50, the second chemical liquid is discharged toward the upper surface central portion of the substrate W from the first discharge port 31a formed on the substrate facing surface 21a of the shielding plate 21. The second chemical liquid supplied to the upper surface of the substrate W moves to the peripheral edge portion of the substrate W by receiving the centrifugal force due to the rotation of the substrate W. The entirety of the upper surface of the substrate W is thereby processed using the first chemical liquid.

When, in the second chemical liquid discharging step S5, a predetermined period elapses from the start of discharge of the second chemical liquid from the first discharge port 31a, the controller 3 closes the common valve 50 and the second chemical liquid supplying valve 57. The discharge of the second chemical liquid from the first discharge port 31a is thereby stopped and the second chemical liquid discharging step S5 ends. At this point, the second chemical liquid is present in the entirety of the flow space SP1 of the connection portion 42.

After the discharge of the second chemical liquid is stopped, the controller 3 makes the first suction apparatus 51 be driven in the state where the common valve 50 is kept closed to suction the second chemical liquid further downstream in the common piping 41 than the first suction apparatus 51. A suction amount of the second chemical liquid in this process is 1 to several milliliters. A leading end surface of the second chemical liquid inside the common piping 41 is thereby made to recede to a predetermined standby position set in the right/left direction portion 41b. By the suction, dripping of the second chemical liquid from the first discharge port 31a can be prevented reliably.

Next, the controller 3 performs a rinsing step S6 (see FIG. 7) of supplying the rinse liquid to the upper surface of the substrate W. The rinsing step S6 is the same step as the rinsing step S4 and description thereof shall thus be omitted.

After the end of the rinsing step S6, the same first suctioning step as that of FIG. 13 is executed.

Next, the spin drying step S7 (see FIG. 7) of drying the substrate W is performed. Specifically, in the state where the shielding plate 21 is disposed at the proximity position, the controller 3 controls the spin motor 16 to accelerate the substrate W to a drying rotational speed (of, for example, several thousand rpm), greater than the rotational speed in the respective steps from the first chemical liquid discharging step S3 to the rinsing step S6, and makes the substrate W rotate at the drying rotational speed. A large centrifugal force is thereby applied to the liquid on the substrate W and the liquid attached to the substrate W is spun off to the periphery of the substrate W. The liquid is thereby removed from the substrate W and the substrate W dries.

When a predetermined period elapses from the acceleration of the substrate W, the controller 3 controls the spin motor 16 to stop the rotation of the substrate W by the spin chuck 5 (S8 of FIG. 7). Thereafter, the controller 3 controls the facing member lifting unit 39 to raise and dispose the shielding plate 21 at the retreat position.

Thereafter, the substrate W is carried out from inside the chamber 4 (S9 of FIG. 7). Specifically, the controller 3 makes the hand of the transfer robot CR enter into the interior of the chamber 4. The controller 3 then makes the hand of the transfer robot CR hold the substrate W on the spin chuck 5. Thereafter, the controller 3 makes the hand of the transfer robot CR retreat from inside the chamber 4. The processed substrate W is thereby carried out from the chamber 4.

By the above, with the present preferred embodiment, the proportion that the volume of the drain-cleaning liquid supplying region E1 occupies in the volume of the entire flow space SP1 is large. Also, the processing common-cleaning liquid supplying region E2 is included in the path leading from the cleaning liquid supplying port 68 to the drain port 63. Therefore, in the connection portion cleaning step, the water can be made to flow through the processing common-cleaning liquid supplying region E2 satisfactorily and consequently, the chemical liquid (the first chemical liquid or the second chemical liquid) can be forced out satisfactorily from the processing common-cleaning liquid supplying region E2 by the water. Remaining of the chemical liquid in the flow space SP1 after the connection portion cleaning step can thus be suppressed or prevented. Contamination of a plurality of types of chemical liquids in the flow space SP1 and crystallization of a chemical liquid at an inner wall of the connection portion 42 can thereby be prevented in advance, and therefore the substrate W can be processed using a clean processing liquid from the connection portion 42.

Also, the volume of the common-cleaning liquid supplying region E2 is greater than the volume of the common-drain region E3. That is, not just the proportion that the volume of the drain-cleaning liquid supplying region E1 occupies in the volume of the entire flow space SP1 but the proportion that the volume of the common-cleaning liquid supplying region E2 occupies in the volume of the entire flow space SP1 is also large. The chemical liquid can thus be forced out satisfactorily from the flow space SP1 both when draining the water, supplied from the cleaning liquid supplying piping 48 to the connection portion 42, to the drain piping 43 and when supplying the water, supplied from the cleaning liquid supplying piping 48 to the connection portion 42, to the common piping 41.

Figure 15:
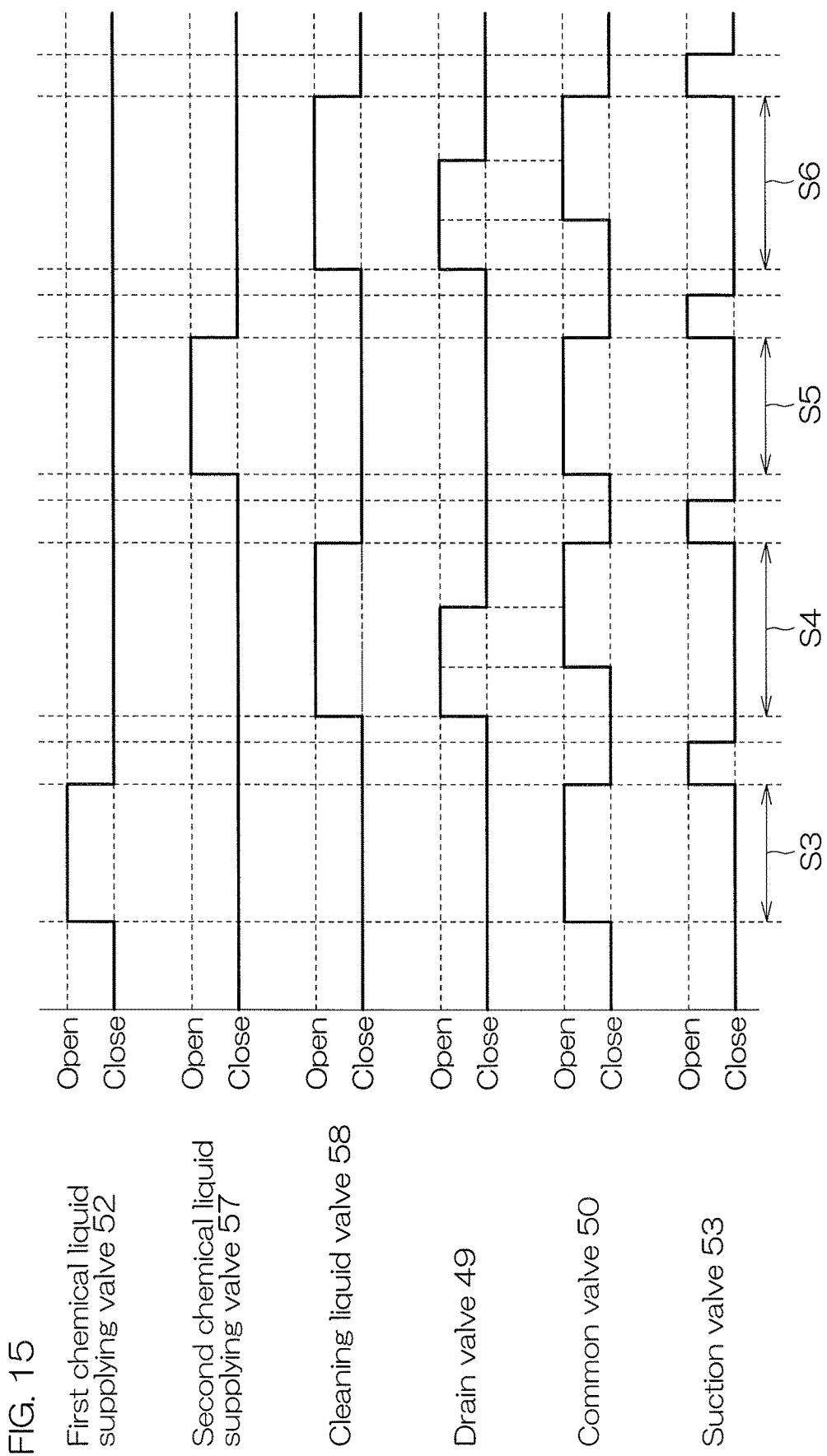
FIG. 15 is a timing chart for describing main control contents of the controller in a modified processing example.

FIG. 15 is a timing chart for describing main control contents of the controller 3 in a modified processing example.

A first point by which the modified processing example according to FIG. 15 differs from the substrate processing example according to FIG. 7 and FIG. 8 is that a second suctioning step is executed after the end of each of the first chemical liquid discharging step S3 and/or the second chemical liquid discharging step S5 (that is, before the connection portion cleaning step). In the second suctioning step, the liquid to be suctioned is not water but is the chemical liquid (the first and/or second chemical liquid). By executing the second suctioning step, all of the chemical liquid present in the interior of the common piping 41 and the flow space SP1 can be drained before the connection portion cleaning step.

Water is supplied to the flow space SP1 after all of the chemical liquid is drained. In this case, the chemical liquid can be drained more satisfactorily from the flow space SP1 in comparison to a case of supplying water to the flow space SP1 in a state where the chemical liquid is present in the flow space SP1. The remaining of the chemical liquid in the flow space SP1 after the connection portion cleaning step can thereby be suppressed more effectively.

Also, a second point by which the modified processing example according to FIG. 15 differs from the substrate processing example according to FIG. 7 and FIG. 8 is that in the rinsing step S4 (rinsing step S6), the opening of the common valve 50 is performed before the closing of the drain valve 49. In this case, the controller 3 opens the common valve 50, the drain valve 49, and the cleaning liquid supplying valve 58 while closing the first chemical liquid supplying valve 52 (second chemical liquid supplying valve 57) to supply the water from the cleaning liquid supplying piping 48 to the connection portion 42 and meanwhile make the water be drained through the drainpipe 43 and make the water be discharged from the first discharge port 31a through the common piping 41 (draining and discharging step (second cleaning step)). The draining and discharging step exhibits an action/effect equivalent to that of the piping cleaning step and, in addition to this action/effect, exhibits an action/effect of shortening the processing time as a result of enabling cleaning of the flow space SP1 of the connection portion 42 and cleaning of the interior of the common piping 41 to be performed in parallel.

Although a preferred embodiment of the present invention was described above, the present invention may be implemented in yet other modes.

For example, although a case of adopting water as the cleaning liquid was taken up as an example with the preferred embodiment described above, a chemical liquid may be adopted instead as the cleaning liquid. The chemical liquid used as the cleaning liquid in this case may be a chemical liquid differing in liquid type from the chemical liquids mentioned above. For example, if a hydrophobizing agent is adopted as the chemical liquid supplied to the connection portion 42, an organic solvent (for example, IPA), may be adopted as the cleaning liquid supplied to the connection portion 42.

Also, in the valve unit V, the number of chemical liquid supplying pipings connected to the connection portion 42 may be one. Even in this case, drying and crystallizing of the chemical liquid on the inner wall of the connection portion 42 can be prevented satisfactorily by performing the connection portion cleaning step. Also, the number of chemical liquid supplying pipings connected to the connection portion 42 may be three or more.

Figure 16:
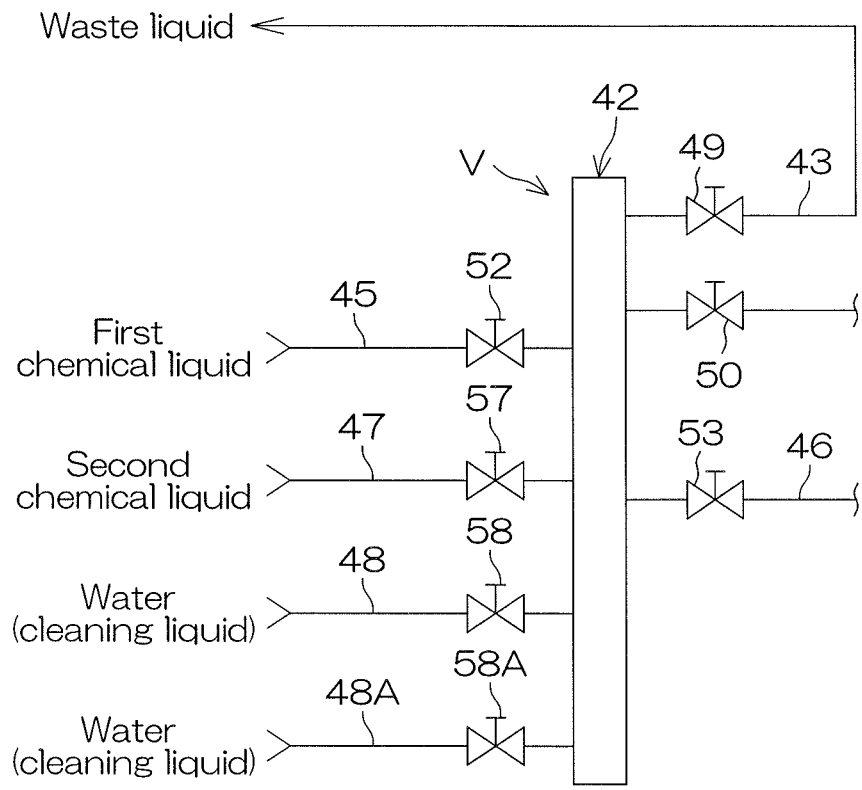
FIG. 16 is a timing chart for describing a valve unit according to a modification example.

Also, in the valve unit V, the number of cleaning liquid supplying pipings connected to the connection portion 42 may be plural. For example, as shown in FIG. 16, a cleaning liquid supplying piping 48A is connected, in addition to the cleaning liquid supplying piping 48, to the connection portion 42. The cleaning liquid supplying piping 48A is opened and closed by a cleaning liquid supplying valve 58A. The cleaning liquid supplying piping 48 and the cleaning liquid supplying piping 48A may be arranged to supply mutually different types of cleaning liquids. For example, one cleaning liquid may be water and the other cleaning liquid may be an organic solvent (for example, IPA). Also, one cleaning liquid may be pure water (DIW) and the other cleaning liquid may be carbonated water. Further, the cleaning liquids of both may be of the same type.

Also, although the common piping, with which the discharge port (first discharge port 31a) is formed on the substrate facing surface 21a, was described with the preferred embodiment above, it may be instead be provided as a single nozzle that is not incorporated in the shielding plate 21. Even in this case, the present invention can be applied favorably to the nozzle if a discharge port of the nozzle is immovable in a right/left direction (that is, a direction along the front surface of the substrate W).

Also, although with the preferred embodiment described above, the case where the substrate processing apparatus 1 is an apparatus that processes the disk-shaped substrate W was described, the substrate processing apparatus 1 may instead be an apparatus that processes a polygonal substrate, such as a glass substrate for a liquid crystal display device, etc.

The valve unit V such as described above has a plurality of valves. Also, each of the processing liquid supplying units 8 to 11 has a valve unit V. That is, a large number of valves are present in relation to the valve units in the processing unit 2.

Figure 17:
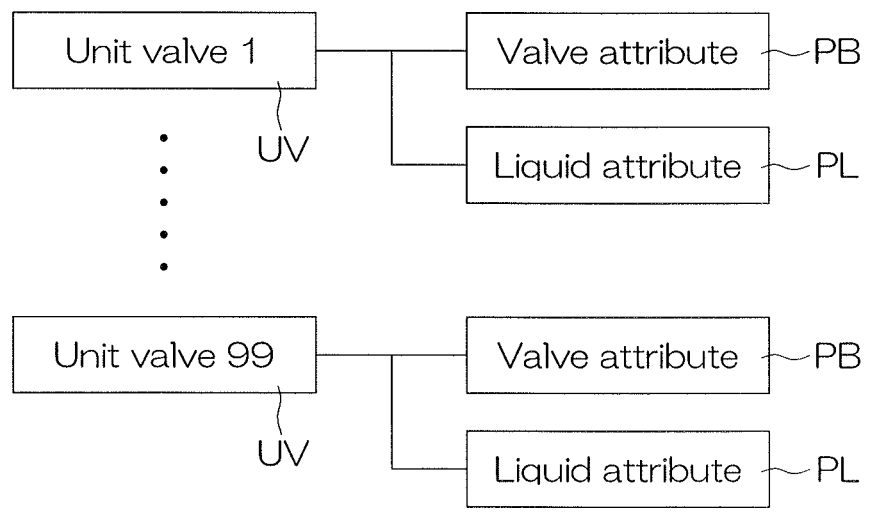
FIG. 17 is a diagram of a general data configuration for unit valves.

The program loaded (stored) in the storage unit of the controller 3 (see FIG. 6) contains definitions concerning operations of valves (hereinafter referred to as "unit valves UV") related to each valve unit. A data configuration such as shown in FIG. 17 may be indicated for example as a general data configuration for the unit valves UV in the program.

In the program of the processing unit 2, for example, up to 99 unit valves UV can be defined. In this case, these unit valves UV are identified by assigning consecutive codes in the manner of: "unit valve 1" and "unit valve 2." Each unit valve UV is given a valve attribute PB and a liquid attribute PL. The valve attribute PB is attribute information distinguishing whether the unit valve UV is an inlet valve (a valve equivalent, for example, to the drain valve 49, common valve 50, and the suction valve 53 of FIG. 5B) or an outlet valve (a valve equivalent, for example, to the first and second chemical liquid supplying valves 52 and 57 and the cleaning liquid supplying valve 58 of FIG. 5B) or other than these. The liquid attribute PL is attribute information distinguishing whether the liquid handled is a chemical liquid or water or other than these.

Figure 18:
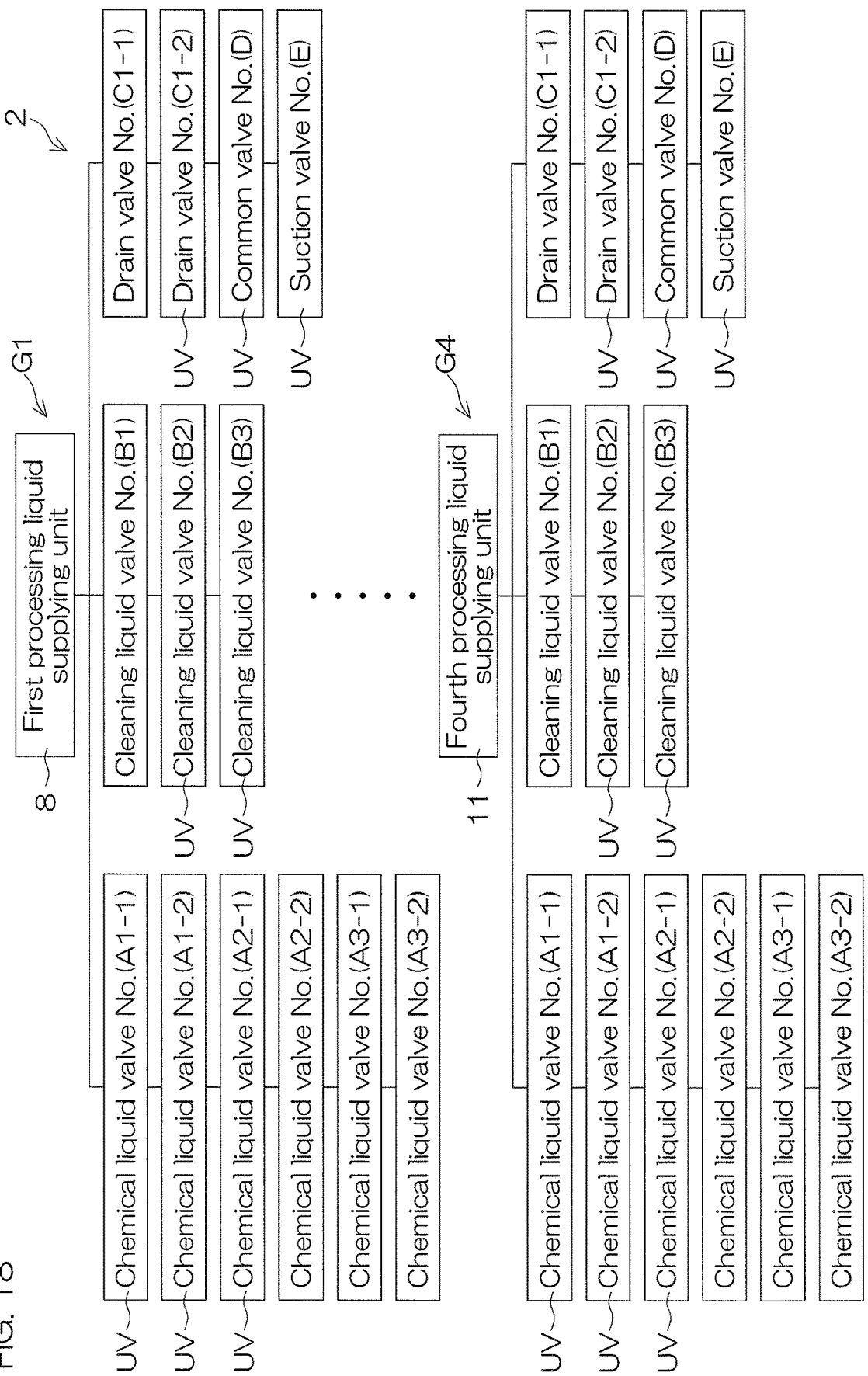
FIG. 18 is a diagram of a data configuration according to a preferred embodiment of the present invention.

The processing unit 2 according to the present preferred embodiment has a data configuration such as shown in FIG. 18 as the data configuration for the unit valves UV.

In FIG. 18, the unit valves UV are largely classified into four, i.e., first to fourth groups G1 to G4 according to which processing liquid supplying unit among the first to fourth processing liquid supplying units 8 to 11 a valve is included in. In each of the groups G1 to G4, the unit valves UV are given identification codes. As shown in FIG. 18, each identification code contains an alphabetic character. Also, depending on the identification code, a numeral is added adjacently to the right of the alphabetic character. Further, depending on the identification code, a branch number is added to the numeral. The alphabetic character at the head is a code for identifying among a chemical liquid supplying valve ("A" in this case), a cleaning liquid supplying valve ("B" in this case), a drain valve ("C" in this case), a common valve ("D" in this case), and a suction valve ("E" in this case). The numeral that follows indicates the type of liquid handled. Further, the branch number indicates an individual identification number for each valve of the same type.

For example, the identification code of the drain valve 49 is "C1-1" of the first group and the identification code of the common valve 50 is "D" of the first group. The identification code of the first chemical liquid supplying valve 52 is "A1-1" of the first group and the identification code of the suction valve 53 is "E" of the first group. The identification code of the second chemical liquid supplying valve 57 is "A2-1" of the first group and the identification code of the cleaning liquid supplying valve 58 is "B1" of the first group.

The controller 3 defines control with a combination of the above data set in a parameter. For example, "during discharge of the chemical liquid to the upper surface of the substrate W," the controller 3 opens a unit valve UV with an identification code containing "A" and a unit valve UV with an identification code containing "B." For "pre-dispensing," the controller 3 opens the unit valve UV with the identification code containing "A" and a unit valve UV with an identification code containing "C." For "connection portion cleaning," the unit valve UV with the identification code containing "B" and the unit valve UV with the identification code containing "C" are opened. For "suction," a unit valve UV with an identification code containing "D" and a unit valve UV with an identification code containing "E" are opened.

By providing such a data configuration, a system engineer can easily come up with an image in a process of data preparation. Also, increase of parameters can be suppressed when adding a unit valve UV anew. Increase and decrease of unit valves UV can thereby be accommodated flexibly.

Besides the above, various design changes may be applied within the scope of the matters described in the claims.

While preferred embodiments of the present invention have been described in detail, these are merely specific examples used to clarify the technical contents of the present invention and the present invention should not be interpreted as being limited to these specific examples and the scope of the present invention are to be limited only by the appended claims.

The present application corresponds to Japanese Patent Application No. 2017-129473 filed on Jun. 30, 2017 in the Japan Patent Office, and the entire disclosure of this application is incorporated herein by reference.

What is claimed is:

1. A substrate processing apparatus comprising:
   a spin chuck which holds a substrate;
   a common piping in communication with a discharge port arranged to discharge a processing liquid toward a major surface of the substrate held by the spin chuck;
   a connection portion connected to the common piping and having, in its interior, a flow space for a liquid to flow through;
   a chemical liquid supplying piping connected to the connection portion and supplying a chemical liquid to the connection portion;

a drain piping connected to the connection portion and through which a liquid, drained from the connection portion, flows; and a cleaning liquid supplying piping connected to the connection portion and supplying a cleaning liquid to the connection portion; and wherein the connection portion has a plurality of ports that are aligned along a flow direction of the flow space and that individually communicate with the flow space at different positions in the flow direction, a plurality of pipings, including the common piping, the chemical liquid supplying piping, the cleaning liquid supplying piping, and the drain piping, are connected to the plurality of ports, respectively, the plurality of ports includes a common port which is connected to one end of the common piping, a drain port which is connected to the drain piping, and a cleaning liquid supplying port which is connected to the cleaning liquid supplying piping, and the common port is disposed between the drain port and the cleaning liquid supplying port with respect to the flow direction of the flow space such that the common port communicates with the flow space at a position between positions at which the drain port and the cleaning liquid supplying port respectively communicate with the flow space.

2. The substrate processing apparatus according to claim 1, wherein the drain port is disposed at one endmost side of the connection portion in the flow direction and the cleaning liquid supplying port is disposed at another endmost side of the connection portion in the flow direction.

3. The substrate processing apparatus according to claim 1, wherein the common port is provided at a position such that, in the connection portion, a volume of a region in the flow space between the common port and the drain port is less than a volume of a region in the flow space between the common port and the cleaning liquid supplying port.

4. The substrate processing apparatus according to claim 3, wherein the common port is provided at a position such that, in the connection portion, a distance between the common port and the drain port is less than a distance between the common port and the cleaning liquid supplying port.

5. The substrate processing apparatus according to claim 1, wherein the discharge port is provided to be immovable in a direction along the major surface of the substrate held by the spin chuck.

6. The substrate processing apparatus according to claim 5, further comprising: a shielding plate, having a substrate facing surface that faces the major surface of the substrate held by the spin chuck and is immovable in a direction along the major surface of the substrate; and wherein the discharge port is formed on the substrate facing surface.

7. The substrate processing apparatus according to claim 1, wherein a plurality of the chemical liquid supplying pipings are connected to the connection portion, and these chemical liquid supplying pipings supply a plurality of mutually different types of chemical liquids to the connection portion.

8. The substrate processing apparatus according to claim 1, wherein a plurality of the cleaning liquid supplying pipings are connected to the connection portion, and these cleaning liquid supplying pipings supply a plurality of mutually different types of cleaning liquids to the connection portion.

9. The substrate processing apparatus according to claim 1, wherein the cleaning liquid is water.

10. The substrate processing apparatus according to claim 1, wherein the cleaning liquid is a chemical liquid differing in liquid type from the chemical liquid.

11. The substrate processing apparatus according to claim 1, further comprising:

a common valve for opening and closing the common piping;

a chemical liquid supplying valve for opening and closing the chemical liquid supplying piping;

a drain valve for opening and closing the drain piping;

a cleaning liquid supplying valve for opening and closing the cleaning liquid supplying piping; and a controller configured to control the opening and closing of the common valve, the chemical liquid supplying valve, the drain valve, and the cleaning liquid supplying valve; and wherein the controller configured to execute executes a chemical liquid discharging step of opening the common valve and the chemical liquid supplying valve while closing the drain valve and the cleaning liquid supplying valve to make the chemical liquid from the chemical liquid supplying piping be supplied to the discharge port via the connection portion and the common piping and be discharged toward the substrate from the discharge port, and a first cleaning step of opening the drain valve and the cleaning liquid supplying valve while closing the common valve and the chemical liquid supplying valve after the chemical liquid discharging step to supply the cleaning liquid from the cleaning liquid supplying piping to the connection portion and make the cleaning liquid be drained through the drain piping.

12. The substrate processing apparatus according to claim 11, wherein the controller configured to further execute a second cleaning step of opening the common valve, the drain valve, and the cleaning liquid supplying valve while closing the chemical liquid supplying valve after the first cleaning step to supply the cleaning liquid from the cleaning liquid supplying piping to the connection portion and meanwhile make the cleaning liquid be drained through the drain piping and be discharged from the discharge port through the common piping.

13. The substrate processing apparatus according to claim 11, wherein the controller configured to further execute a third cleaning step of opening the common valve and the cleaning liquid supplying valve while closing the chemical liquid supplying valve and the drain valve after the first cleaning step to supply the cleaning liquid from the cleaning liquid supplying piping to the connection portion and meanwhile make the cleaning liquid be discharged from the discharge port through the common piping.

14. The substrate processing apparatus according to claim 11, further comprising:

a suction piping connected to the connection portion;

a suction apparatus for evacuating an interior of the suction piping; and a suction valve for opening and closing the suction piping; and wherein the controller configured to further control operation of the suction apparatus and controls the opening and closing of the suction valve, and the controller configured to further execute a first suctioning step of suctioning all of the liquid present in an interior of the common piping and in the flow space by the suction apparatus after the first cleaning step.

15. The substrate processing apparatus according to claim 11, further comprising:
- a suction piping connected to the connection portion;
- a suction apparatus for evacuating an interior of the suction piping; and
- a suction valve for opening and closing the suction piping; and
- wherein the controller configured to further control operation of the suction apparatus and controls the opening and closing of the suction valve, and
- the controller configured to further execute a second suctioning step of suctioning all of the liquid present in an interior of the common piping and in the flow space by the suction apparatus before the first cleaning step.

* * * * *